United States Patent
Khlat

(10) Patent No.: US 10,243,537 B2
(45) Date of Patent: Mar. 26, 2019

(54) COMPENSATION CIRCUIT FOR USE WITH ACOUSTIC RESONATORS TO PROVIDE A BANDSTOP

(71) Applicant: Qorvo US, Inc., Greensboro, NC (US)

(72) Inventor: Nadim Khlat, Cugnaux (FR)

(73) Assignee: Qorvo US, Inc., Greensboro, NC (US)

( * ) Notice: Subject to any disclaimer, the term of this patent is extended or adjusted under 35 U.S.C. 154(b) by 82 days.

(21) Appl. No.: 15/347,428

(22) Filed: Nov. 9, 2016

(65) Prior Publication Data

US 2017/0201233 A1 Jul. 13, 2017

Related U.S. Application Data

(60) Provisional application No. 62/277,726, filed on Jan. 12, 2016.

(51) Int. Cl.
*H03H 9/54* (2006.01)
*H03H 9/64* (2006.01)
*H03H 9/60* (2006.01)

(52) U.S. Cl.
CPC ............ *H03H 9/542* (2013.01); *H03H 9/605* (2013.01); *H03H 9/6406* (2013.01); *H03H 9/6483* (2013.01)

(58) Field of Classification Search
CPC ........... H03H 9/02086; H03H 9/02433; H03H 9/02818; H03H 9/542; H03H 9/547; H03H 9/605; H03H 9/6406; H03H 9/6409; H03H 9/6483; H03H 9/6489
USPC .................................................. 333/193–196
See application file for complete search history.

(56) References Cited

U.S. PATENT DOCUMENTS

| | | |
|---|---|---|
| 3,731,230 A | 5/1973 | Cerny, Jr. |
| 3,875,533 A | 4/1975 | Irwin et al. |
| 4,577,168 A | 3/1986 | Hartmann |
| 5,291,159 A | 3/1994 | Vale |

(Continued)

FOREIGN PATENT DOCUMENTS

JP 2012-257050 * 12/2012

OTHER PUBLICATIONS

Author Unknown, "SAW Filters—SAW Resonators: Surface Acoustic Wave SAW Components," Product Specification, 2010, Token Electronics Industry Co., Ltd., 37 pages.

(Continued)

*Primary Examiner* — Barbara Summons
(74) *Attorney, Agent, or Firm* — Withrow & Terranova, P.L.L.C.

(57) ABSTRACT

Filter circuitry uses acoustic resonators to provide a frequency response having a stopband between two passbands. The filter circuitry includes at least one series acoustic resonator coupled between an input node and an output node. A compensation circuit is also coupled between the input node and the output node. The compensation circuit includes a first inductor and a second inductor coupled in series between the input node and the output node. The first inductor and the second inductor are negatively coupled with one another, wherein a common node is provided between the first inductor and the second inductor. A shunt circuit is coupled between the common node and a fixed voltage node. The shunt circuit includes a shunt inductor coupled in series with a plurality of parallel-coupled shunt acoustic resonators.

24 Claims, 19 Drawing Sheets

(56) References Cited

U.S. PATENT DOCUMENTS

| | | | |
|---|---|---|---|
| 6,067,391 | A | 5/2000 | Land |
| 6,714,099 | B2 | 3/2004 | Hikita et al. |
| 6,720,844 | B1 | 4/2004 | Lakin |
| 7,804,374 | B1 | 9/2010 | Brown et al. |
| 8,576,024 | B2 | 11/2013 | Erb et al. |
| 8,923,794 | B2 | 12/2014 | Aigner |
| 2005/0093648 | A1 | 5/2005 | Inoue |
| 2008/0007369 | A1* | 1/2008 | Barber .............. H03H 9/02086 333/189 |
| 2010/0277237 | A1 | 11/2010 | Sinha et al. |
| 2011/0210787 | A1 | 9/2011 | Lee et al. |
| 2015/0222246 | A1 | 8/2015 | Nosaka |
| 2015/0369153 | A1 | 12/2015 | Tsunooka et al. |
| 2016/0028364 | A1* | 1/2016 | Takeuchi ............ H03H 9/6433 333/133 |
| 2016/0191012 | A1 | 6/2016 | Khlat et al. |
| 2016/0191014 | A1 | 6/2016 | Khlat et al. |
| 2016/0191016 | A1 | 6/2016 | Khlat et al. |
| 2016/0261235 | A1 | 9/2016 | Ortiz |
| 2017/0301992 | A1* | 10/2017 | Khlat .................... H01Q 5/335 |
| 2017/0324159 | A1* | 11/2017 | Khlat .................... H01Q 1/525 |
| 2018/0013402 | A1* | 1/2018 | Kirkpatrick .............. H03H 9/25 |
| 2018/0076793 | A1* | 3/2018 | Khlat .................... H03H 9/568 |
| 2018/0076794 | A1* | 3/2018 | Khlat .................... H03H 9/584 |
| 2018/0109237 | A1* | 4/2018 | Wasilik ................. H03H 9/105 |

OTHER PUBLICATIONS

Fattinger, Gernot et al., "Miniaturization of BAW Devices and the Impact of Wafer Level Packaging Technology," Joint UFFC, EFTF and PFM Symposium, Jul. 21-25, 2013, Prague, Czech Republic, IEEE, pp. 228-231.

Kwa, Tom, "Wafer-Level Packaged Accelerometer With Solderable SMT Terminals," IEEE Sensors, Oct. 22-25, 2006, Daegu, South Korea, IEEE, pp. 1361-1364.

Potter, Bob R. et al., "Embedded Inductors Incorporated in the Design of SAW Module SMT Packaging," Proceedings of the 2002 Ultrasonics Symposium, Oct. 8-11, 2002, IEEE, pp. 397-400.

Schneider, Robert, "High-Q AlN Contour Mode Resonators with Unattached, Voltage-Actuated Electrodes," Thesis, Technical Report No. UCB/EECS-2015-247, Dec. 17, 2015, Electrical Engineering and Computer Sciences, University of California at Berkeley, http://www.eecs.berkeley.edu/Pubs/TechRpts/2015/EECS-2015-247.html, Robert Anthony Schneider, 222 pages.

Non-Final Office Action for U.S. Appl. No. 14/757,587, dated Sep. 13, 2016, 12 pages.

Notice of Allowance for U.S. Appl. No. 14/757,587, dated Mar. 9, 2017, 8 pages.

Non-Final Office Action for U.S. Appl. No. 15/004,084, dated Jun. 12, 2017, 9 pages.

Non-Final Office Action for U.S. Appl. No. 14/757,651, dated Jun. 9, 2017, 11 pages.

Non-Final Office Action for U.S. Appl. No. 15/275,957, dated Jun. 14, 2017, 9 pages.

Ex Parte Quayle Action for U.S. Appl. No. 15/347,452, mailed Jun. 15, 2017, 7 pages.

U.S. Appl. No. 15/490,381, filed Apr. 18, 2017.
U.S. Appl. No. 15/586,374, filed May 4, 2017.
U.S. Appl. No. 15/644,922, filed Jul. 10, 2017.
U.S. Appl. No. 15/697,658, filed Sep. 7, 2017.
U.S. Appl. No. 15/701,759, filed Sep. 12, 2017.
U.S. Appl. No. 15/727,117, filed Oct. 6, 2017.
U.S. Appl. No. 15/720,706, filed Sep. 29, 2017.

Lakin, K. M., "Coupled Resonator Filters," 2002 IEEE Ultrasonics Symposium, Oct. 8-11, 2002, Munich, Germany, 8 pages.

López, Edén Corrales, "Analysis and Design of Bulk Acoustic Wave Filters Based on Acoustically Coupled Resonators," PhD Thesis, Department of Telecommunications and Systems Engineering, Autonomous University of Barcelona, May 2011, 202 pages.

Shirakawa, A. A., et al., "Bulk Acoustic Wave-Coupled Resonator Filters: Concept, Design, and Application," International Journal of RF and Microwave Computer-Aided Engineering, vol. 21, No. 5, Sep. 2011, 9 pages.

Final Office Action for U.S. Appl. No. 15/275,957, dated Jan. 2, 2018, 7 pages.

Non-Final Office Action for U.S. Appl. No. 14/757,651, dated May 8, 2018, 8 pages.

Notice of Allowance for U.S. Appl. No. 15/490,381, dated May 23, 2018, 8 pages.

Final Office Action for U.S. Appl. No. 14/757,651, dated Sep. 19, 2018, 7 pages.

Non-Final Office Action for U.S. Appl. No. 15/701,759, dated Oct. 4, 2018, 10 pages.

Corrales, Eden, et al., "Design of Three-Pole Bulk Acoustic Wave Coupled Resonator Filters," 38th European Microwave Conference, Oct. 2008, Amsterdam, Netherlands, EuMA, pp. 357-360.

De Paco, Pedro, et al., "Equivalent Circuit Modeling of Coupled Resonator Filters," Transactions on Ultrasonics, Ferroelectrics, and Frequency Control, vol. 55, Issue 9, Sep. 2008, IEEE, pp. 2030-2037.

Lakin, K. M., "Bulk Acoustic Wave Coupled Resonator Filters," International Frequency Control Symposium, 2002, IEEE, pp. 8-14.

Shirakawa, A. A., et al., "Bulk Acoustic Wave Coupled Resonator Filters Synthesis Methodology," European Microwave Conference, Oct. 4-6, 2005, Paris, France, IEEE, 4 pages.

Tosic, Dejan, et al., "Symbolic analysis of immitance inverters," 14th Telecommunications Forum, Nov. 21-23, 2006, Belgrade, Serbia, pp. 584-587.

* cited by examiner

T-MODEL OF COMPENSATION CIRCUIT

π MODEL OF COMPENSATION CIRCUIT

COMPENSATION CIRCUIT FOR USE WITH ACOUSTIC RESONATORS TO PROVIDE A BANDSTOP

RELATED APPLICATIONS

This application claims the benefit of provisional patent application Ser. No. 62/277,726, filed Jan. 12, 2016, the disclosure of which is hereby incorporated herein by reference in its entirety.

FIELD OF THE DISCLOSURE

The present disclosure relates to acoustic resonators and in particular to a compensation circuit to use with acoustic resonators to provide a bandstop.

BACKGROUND

Acoustic resonators, such as Surface Acoustic Wave (SAW) resonators and Bulk Acoustic Wave (BAW) resonators, are used in many high-frequency communication applications. In particular, SAW resonators are often employed in filter networks that operate frequencies up to 1.8 GHz, and BAW resonators are often employed in filter networks that operate at frequencies above 1.5 GHz. Such filters need to have flat passbands, have steep filter skirts and squared shoulders at the upper and lower ends of the passband, and provide excellent rejection outside of the passband. SAW- and BAW-based filters also have relatively low insertion loss, tend to decrease in size as the frequency of operation increases, and are relatively stable over wide temperature ranges. As such, SAW- and BAW-based filters are the filter of choice for many 3rd Generation (3G) and 4th Generation (4G) wireless devices and are destined to dominate filter applications for 5th Generation (5G) wireless devices. Most of these wireless devices support cellular, wireless fidelity (Wi-Fi), Bluetooth, and/or near field communications on the same wireless device and, as such, pose extremely challenging filtering demands. While these demands keep raising the complexity of wireless devices, there is a constant need to improve the performance of acoustic resonators and filters that are based thereon.

To better understand acoustic resonators and various terminology associated therewith, the following provides an overview of a BAW resonator. However, the concepts described herein may employ any type of acoustic resonator and are not limited to SAW- and BAW-based resonators. An exemplary BAW resonator 10 is illustrated in FIG. 1. The BAW resonator 10 generally includes a substrate 12, a reflector 14 mounted over the substrate 12, and a transducer 16 mounted over the reflector 14. The transducer 16 rests on the reflector 14 and includes a piezoelectric layer 18, which is sandwiched between a top electrode 20 and a bottom electrode 22. The top and bottom electrodes 20 and 22 may be formed of Tungsten (W), Molybdenum (Mo), Platinum (Pt), or like material, and the piezoelectric layer 18 may be formed of Aluminum Nitride (AlN), Zinc Oxide (ZnO), or other appropriate piezoelectric material. Although shown in FIG. 1 as each including a single layer, the piezoelectric layer 18, the top electrode 20, and/or the bottom electrode 22 may include multiple layers of the same material, multiple layers in which at least two layers are different materials, or multiple layers in which each layer is a different material.

The BAW resonator 10 is divided into an active region 24 and an outside region 26. The active region 24 generally corresponds to the section of the BAW resonator 10 where the top and bottom electrodes 20 and 22 overlap and also includes the layers below the overlapping top and bottom electrodes 20 and 22. The outside region 26 corresponds to the section of the BAW resonator 10 that surrounds the active region 24.

For the BAW resonator 10, applying electrical signals across the top electrode 20 and the bottom electrode 22 excites acoustic waves in the piezoelectric layer 18. These acoustic waves primarily propagate vertically. A primary goal in BAW resonator design is to confine these vertically propagating acoustic waves in the transducer 16. Acoustic waves traveling upward are reflected back into the transducer 16 by the air-metal boundary at the top surface of the top electrode 20. Acoustic waves traveling downward are reflected back into the transducer 16 by the reflector 14 or by an air cavity, which is provided just below the transducer in a Film BAW Resonator (FBAR).

The reflector 14 is typically formed by a stack of reflector layers (RL) 28, which alternate in material composition to produce a significant reflection coefficient at the junction of adjacent reflector layers 28. Typically, the reflector layers 28 alternate between materials having high and low acoustic impedances, such as tungsten (W) and silicon dioxide ($SiO_2$). While only five reflector layers 28 are illustrated in FIG. 1, the number of reflector layers 28 and the structure of the reflector 14 varies from one design to another.

The magnitude (Z) and phase ($\phi$) of the electrical impedance as a function of the frequency for a relatively idea BAW resonator 10 is provided in FIG. 2. The magnitude (Z) of the electrical impedance is illustrated by the solid line, whereas the phase ($\phi$) of the electrical impedance is illustrated by the dashed line. A unique feature of the BAW resonator 10 is that it has both a resonance frequency and an anti-resonance frequency. The resonance frequency is typically referred to as the series resonance frequency ($f_s$), and the anti-resonance frequency is typically referred to as the parallel resonance frequency ($f_p$). The series resonance frequency ($f_s$) occurs when the magnitude of the impedance, or reactance, of the BAW resonator 10 approaches zero. The parallel resonance frequency ($f_p$) occurs when the magnitude of the impedance, or reactance, of the BAW resonator 10 peaks at a significantly high level. In general, the series resonance frequency ($f_s$) is a function of the thickness of the piezoelectric layer 18 and the mass of the bottom and top electrodes 20 and 22.

For the phase, the BAW resonator 10 acts like an inductance that provides a 90° phase shift between the series resonance frequency ($f_s$) and the parallel resonance frequency ($f_p$). In contrast, the BAW resonator 10 acts like a capacitance that provides a −90° phase shift below the series resonance frequency ($f_s$) and above the parallel resonance frequency ($f_p$). The BAW resonator 10 presents a very low, near zero, resistance at the series resonance frequency ($f_s$) and a very high resistance at the parallel resonance frequency ($f_p$). The electrical nature of the BAW resonator 10 lends itself to the realization of a very high Q (quality factor) inductance over a relatively short range of frequencies, which has proven to be very beneficial in high-frequency filter networks, especially those operating at frequencies around 1.8 GHz and above.

Unfortunately, the phase ($\phi$) curve of FIG. 2 is representative of an ideal phase curve. In reality, approaching this ideal is challenging. A typical phase curve for the BAW resonator 10 of FIG. 1 is illustrated in FIG. 3A. Instead of being a smooth curve, the phase curve of FIG. 3A includes ripple below the series resonance frequency ($f_s$), between the series resonance frequency ($f_s$) and the parallel resonance frequency ($f_p$), and above the parallel resonance frequency ($f_p$). The ripple is the result of spurious modes, which are caused by spurious resonances that occur in corresponding frequencies. While the vast majority of the acoustic waves in the BAW resonator 10 propagate vertically, various boundary conditions about the transducer 16 result in the propagation of lateral (horizontal) acoustic waves, which are referred to as lateral standing waves. The presence of these lateral standing waves reduces the potential Q associated with the BAW resonator 10.

As illustrated in FIG. 4, a border (BO) ring 30 is formed on or within the top electrode 20 to suppress certain of the spurious modes. The spurious modes that are suppressed by the BO ring 30 are those above the series resonance frequency ($f_s$), as highlighted by circles A and B in the phase curve of FIG. 3B. Circle A shows a suppression of the ripple, and thus of the spurious mode, in the passband of the phase curve, which resides between the series resonance frequency ($f_s$) and the parallel resonance frequency ($f_p$). Circle B shows suppression of the ripple, and thus of the spurious modes, above the parallel resonance frequency ($f_p$). Notably, the spurious mode in the upper shoulder of the passband, which is just below the parallel resonance frequency $f_p$, and the spurious modes above the passband are suppressed, as evidenced by the smooth or substantially ripple-free phase curve between the series resonance frequency ($f_s$) and the parallel resonance frequency ($f_p$) and above the parallel resonance frequency ($f_p$).

The BO ring 30 corresponds to a mass loading of the portion of the top electrode 20 that extends about the periphery of the active region 24. The BO ring 30 may correspond to a thickened portion of the top electrode 20 or the application of additional layers of an appropriate material over the top electrode 20. The portion of the BAW resonator 10 that includes and resides below the BO ring 30 is referred to as a BO region 32. Accordingly, the BO region 32 corresponds to an outer, perimeter portion of the active region 24 and resides inside of the active region 24.

While the BO ring 30 is effective at suppressing spurious modes above the series resonance frequency ($f_s$), the BO ring 30 has little or no impact on those spurious modes below the series resonance frequency ($f_s$), as shown by the ripples in the phase curve below the series resonance frequency ($f_s$) in FIG. 3B. A technique referred to as apodization is often used to suppress the spurious modes that fall below the series resonance frequency ($f_s$).

Apodization tries to avoid, or at least significantly reduce, any lateral symmetry in the BAW resonator 10, or at least in the transducer 16 thereof. The lateral symmetry corresponds to the footprint of the transducer 16, and avoiding lateral symmetry corresponds to avoiding symmetry associated with the sides of the footprint. For example, one may choose a footprint that corresponds to a pentagon instead of a square or rectangle. Avoiding symmetry helps reduce the presence of lateral standing waves in the transducer 16. Circle C of FIG. 3C illustrates the effect of apodization in which the spurious modes below the series resonance frequency ($f_s$) are suppressed, as evidence by the smooth or substantially ripple-free phase curve below the series resonance frequency ($f_s$). Assuming no BO ring 30 is provided, one can readily see in FIG. 3C that apodization fails to suppress those spurious modes above the series resonance frequency ($f_s$). As such, the typical BAW resonator 10 employs both apodization and the BO ring 30.

As noted previously, BAW resonators 10 are often used in filter networks that operate at high frequencies and require high Q values. A basic ladder network 40 is illustrated in FIG. 5A. The ladder network 40 includes two series resonators $B_{SER}$ and two shunt resonators $B_{SH}$, which are arranged in a traditional ladder configuration. Typically, the series resonators $B_{SER}$ have the same or similar first frequency response, and the shunt resonators $B_{SH}$ have the same or similar second frequency response, which is different from the first frequency response, as shown in FIG. 5B. In many applications, the shunt resonators $B_{SH}$ are detuned versions of the series resonators $B_{SER}$. As a result, the frequency responses for the series resonators $B_{SER}$ and the shunt resonators $B_{SH}$ are generally very similar, yet shifted relative to one another such that the parallel resonance frequency ($f_{p,SH}$) of the shunt resonators approximates the series resonance frequency ($f_{s,SER}$) of the series resonators $B_{SER}$. Note that the series resonance frequency ($f_{s,SH}$) of the shunt resonators $B_{SH}$ is less than the series resonance frequency ($f_{s,SER}$) of the series resonators $B_{SER}$. The parallel resonance frequency ($f_{p,SH}$) of the shunt resonators $B_{SH}$ is less than the parallel resonance frequency ($f_{p,SER}$) of the series resonators $B_{SER}$.

FIG. 5C is associated with FIG. 5B and illustrates the response of the ladder network 40. The series resonance frequency ($f_{s,SH}$) of the shunt resonators $B_{SH}$ corresponds to the low side of the passband's skirt (phase 2), and the parallel resonance frequency ($f_{p,SER}$) of the series resonators $B_{SER}$ corresponds to the high side of the passband's skirt (phase 4). The substantially aligned series resonance frequency ($f_{s,SER}$) of the series resonators $B_{SER}$ and the parallel resonance frequency ($f_{p,SH}$) of the shunt resonators $B_{SH}$ fall within the passband.

FIGS. 6A through 6E provide circuit equivalents for the five phases of the response of the ladder network 40. During the first phase (phase 1, FIGS. 5C, 6A), the ladder network 40 functions to attenuate the input signal. As the series resonance frequency ($f_{s,SH}$) of the shunt resonators $B_{SH}$ is approached, the impedance of the shunt resonators $B_{SH}$ drops precipitously such that the shunt resonators $B_{SH}$ essentially provide a short to ground at the series resonance frequency ($f_{s,SH}$) of the shunt resonators (phase 2, FIGS. 5C, 6B). At the series resonance frequency ($f_{s,SH}$) of the shunt resonators $B_{SH}$ (phase 2), the input signal is essentially blocked from the output of the ladder network 40.

Between the series resonance frequency ($f_{s,SH}$) of the shunt resonators $B_{SH}$ and the parallel resonance frequency ($f_{p,SER}$) of the series resonators $B_{SER}$, which corresponds to the passband, the input signal is passed to the output with relatively little or no attenuation (phase 3, FIGS. 5C, 6C). Within the passband, the series resonators $B_{SER}$ present relatively low impedance, whereas the shunt resonators $B_{SH}$ present a relatively high impedance, wherein the combination of the two leads to a flat passband with steep low- and high-side skirts. As the parallel resonance frequency ($f_{p,SER}$) of the series resonators $B_{SER}$ is approached, the impedance of the series resonators $B_{SER}$ becomes very high, such that the series resonators $B_{SER}$ essentially present themselves as open at the parallel resonance frequency ($f_{p,SER}$) of the series resonators (phase 4, FIGS. 5C, 6D). At the parallel resonance frequency ($f_{p,SER}$) of the series resonators $B_{SER}$ (phase 4), the input signal is again essentially blocked from the output of the ladder network 40. During the final phase (phase 5, FIGS. 5C, 6E), the ladder network 40 functions to attenuate the input signal, in a similar fashion to that provided in phase 1. As the parallel resonance frequency ($f_{p,SER}$) of the series resonators $B_{SER}$ is passed, the impedance of the series resonators $B_{SER}$ decreases and the impedance of the shunt resonators $B_{SH}$ normalizes. Thus, the ladder network 40 functions to provide a high Q passband between the series resonance frequency ($f_{s,SH}$) of the shunt resonators $B_{SH}$ and the parallel resonance frequency ($f_{p,SER}$) of the series resonators $B_{SER}$. The ladder network 40 provides extremely high attenuation at both the series resonance frequency ($f_{s,SH}$) of the shunt resonators $B_{SH}$ and the parallel resonance frequency ($f_{p,SER}$) of the series resonators. The ladder network 40 provides good attenuation below the series resonance frequency ($f_{s,SH}$) of the shunt resonators $B_{SH}$ and above the parallel resonance frequency ($f_{p,SER}$) of the series resonators $B_{SER}$. As noted previously, there is a constant need to improve the performance of acoustic resonators and filters that are based thereon.

Those skilled in the art will appreciate the scope of the present disclosure and realize additional aspects thereof after reading the following detailed description of the preferred embodiments in association with the accompanying drawing figures.

SUMMARY

The present disclosure relates to filter circuitry that uses acoustic resonators to provide a frequency response with a stopband. The filter circuitry includes at least one series acoustic resonator coupled between the input node and the output node, wherein at least one main series resonance is provided between the input node and the output node at a main resonance frequency through the at least one series acoustic resonator. A compensation circuit is coupled between the input node and the output node. The compensation circuit includes a first inductor and a second inductor coupled in series between the input node and the output node. The first inductor and the second inductor are negatively coupled with one another, wherein a common node is provided between the first inductor and the second inductor. The compensation circuit further comprises a shunt circuit coupled between the common node and a fixed voltage node. The shunt circuit includes a shunt inductor coupled in series with a plurality of parallel-coupled shunt acoustic resonators, which includes a first shunt acoustic resonator coupled in parallel with a second shunt acoustic resonator. A transfer function of the filter circuitry between the input node and the output node provides a frequency response with a stopband between two passbands.

BRIEF DESCRIPTION OF THE DRAWING FIGURES

The accompanying drawing figures incorporated in and forming a part of this specification illustrate several aspects of the disclosure and, together with the description, serve to explain the principles of the disclosure.

DETAILED DESCRIPTION

Figure 1:
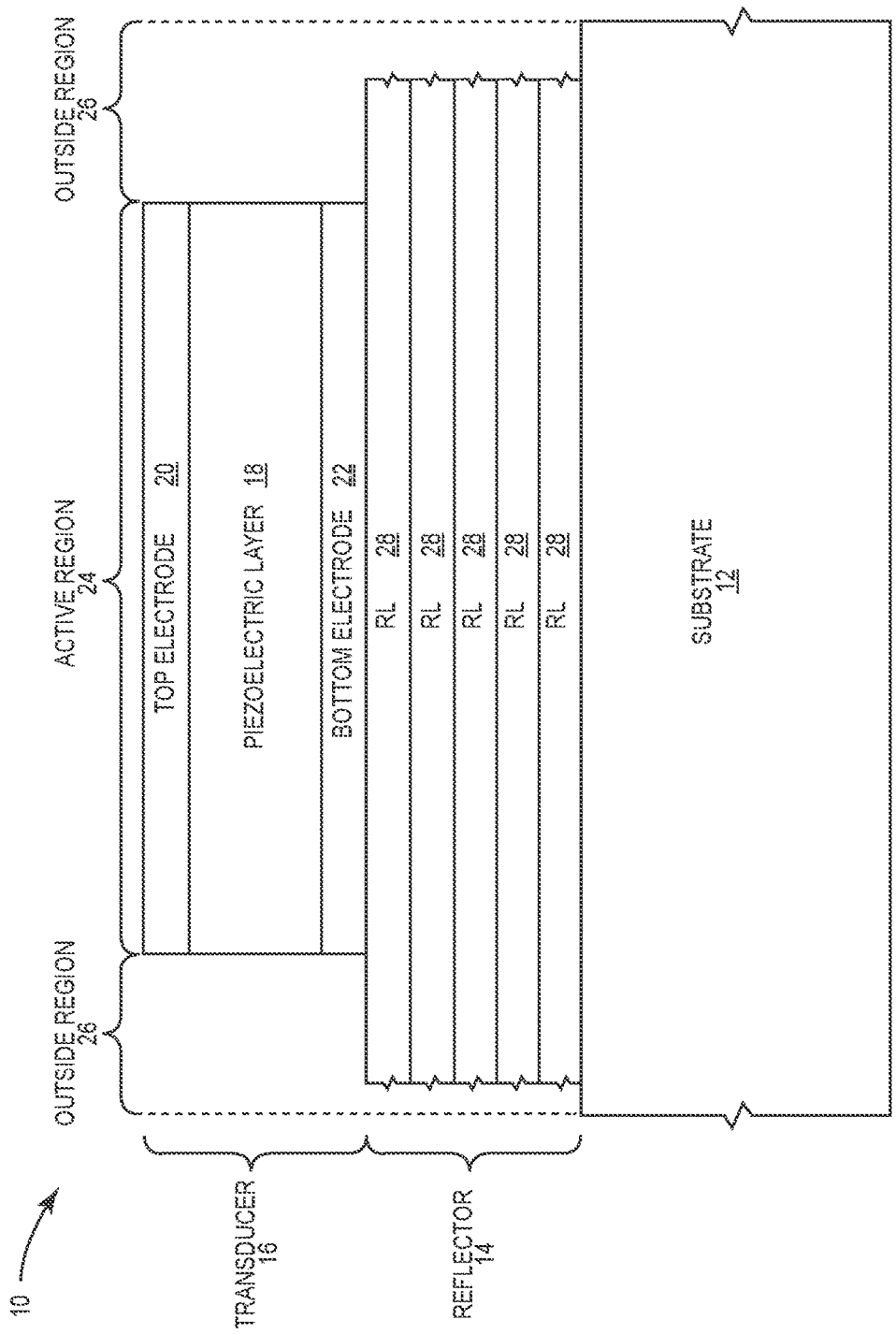
FIG. 1 illustrates a conventional Bulk Acoustic Wave (BAW) resonator.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the figures. It will be understood that these terms and those discussed previously are intended to encompass different orientations of the device in addition to the orientation depicted in the figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

The present disclosure relates to filter circuitry that uses acoustic resonators to provide a frequency response with a stopband. The filter circuitry includes at least one series acoustic resonator coupled between the input node and the output node, wherein at least one main series resonance is provided between the input node and the output node at a main resonance frequency through the at least one series acoustic resonator. A compensation circuit is coupled between the input node and the output node. The compensation circuit includes a first inductor and a second inductor coupled in series between the input node and the output node. The first inductor and the second inductor are negatively coupled with one another, wherein a common node is provided between the first inductor and the second inductor. The compensation circuit further comprises a shunt circuit coupled between the common node and a fixed voltage node. The shunt circuit includes a shunt inductor coupled in series with a plurality of parallel-coupled shunt acoustic resonators, which includes a first shunt acoustic resonator coupled in parallel with a second shunt acoustic resonator. A transfer function of the filter circuitry between the input node and the output node provides a frequency response with a stopband between two passbands. Details are provided below.

To better appreciate the compensation circuits of the present disclosure that facilitates the stopband response, an overview of two compensation circuits that facilitate passband responses are initially described. Details of compensation circuits that facilitate the stopband response will follow the description of the compensation circuit that provides the passband response.

Figure 7:
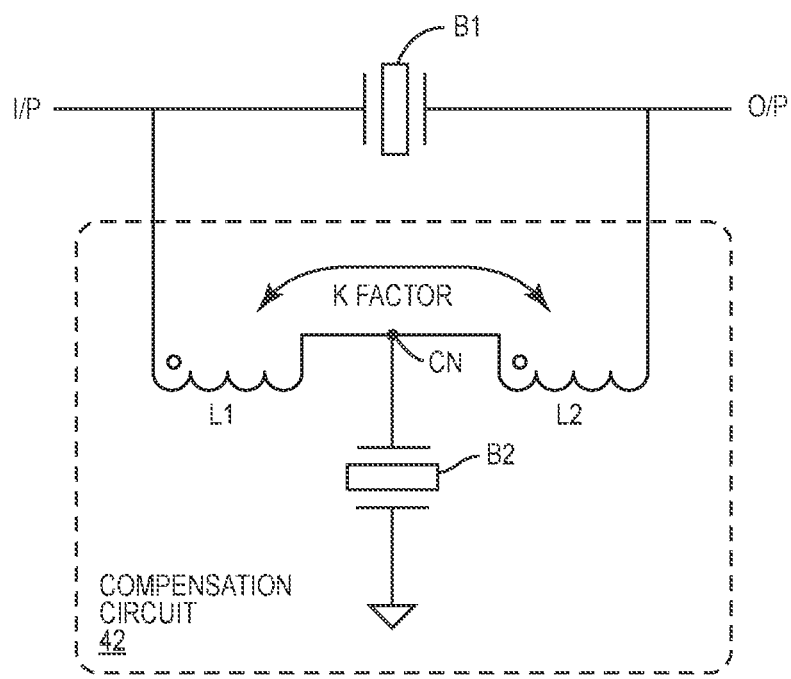
FIG. 7 illustrates an acoustic resonator in parallel with a compensation circuit, which includes a single shunt acoustic resonator.

Turning now to FIG. 7, a series resonator B1 is shown coupled between an input node I/P and an output node O/P. The series resonator B1 has a series resonance frequency $F_s$ and inherent capacitance, which generally limits the bandwidth of filters that employ the series resonator B1. In the case of a Bulk Acoustic Wave (BAW) resonator, the capacitance of the series resonator B1 is primarily caused by its inherent structure, which looks and acts like a capacitor in part because the series resonator includes the top and bottom electrodes 20, 22 (FIG. 1) that are separated by a dielectric piezoelectric layer 18 (FIG. 1). While BAW resonators are the focus of the example, other types of acoustic resonators, such as Surface Acoustic Wave resonators, are equally applicable.

A compensation circuit 42 is coupled in parallel with the series resonator B1 and functions to compensate for some of the capacitance presented by the series resonator B1. The compensation circuit 42 includes two negatively coupled inductors L1, L2 and a shunt resonator B2. The inductors L1, L2 are coupled in series between the input node I/P and the output node O/P, wherein a common node CN is provided between the inductors L1, L2. The inductors L1, L2 are magnetically coupled by a coupling factor K, wherein the dots illustrated in association with the inductors L1, L2 indicate that the magnetic coupling is negative. As such, the inductors L1, L2 are connected in electrical series and negatively coupled from a magnetic coupling perspective. As defined herein, two (or more) series-connected inductors that are negatively coupled from a magnetic perspective are inductors that are:
  connected in electrical series; and
  the mutual inductance between the two inductors functions to decrease the total inductance of the two (or more) inductors.
The shunt resonator B2 is coupled between the common node CN and ground, or other fixed voltage node.

Figure 2:
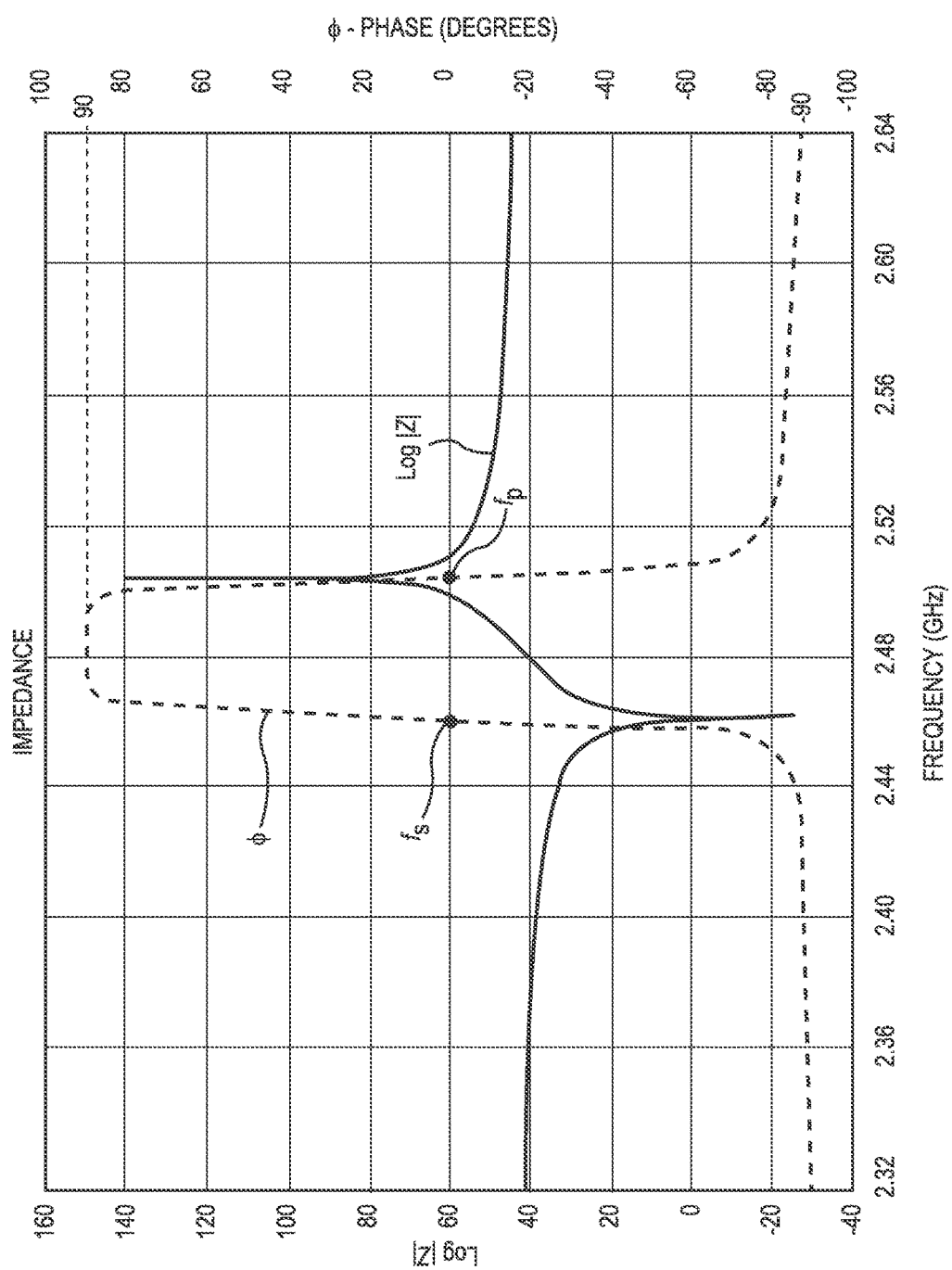
FIG. 2 is a graph of the magnitude and phase of impedance over frequency responses as a function of frequency for an ideal BAW resonator.
Figure 3:
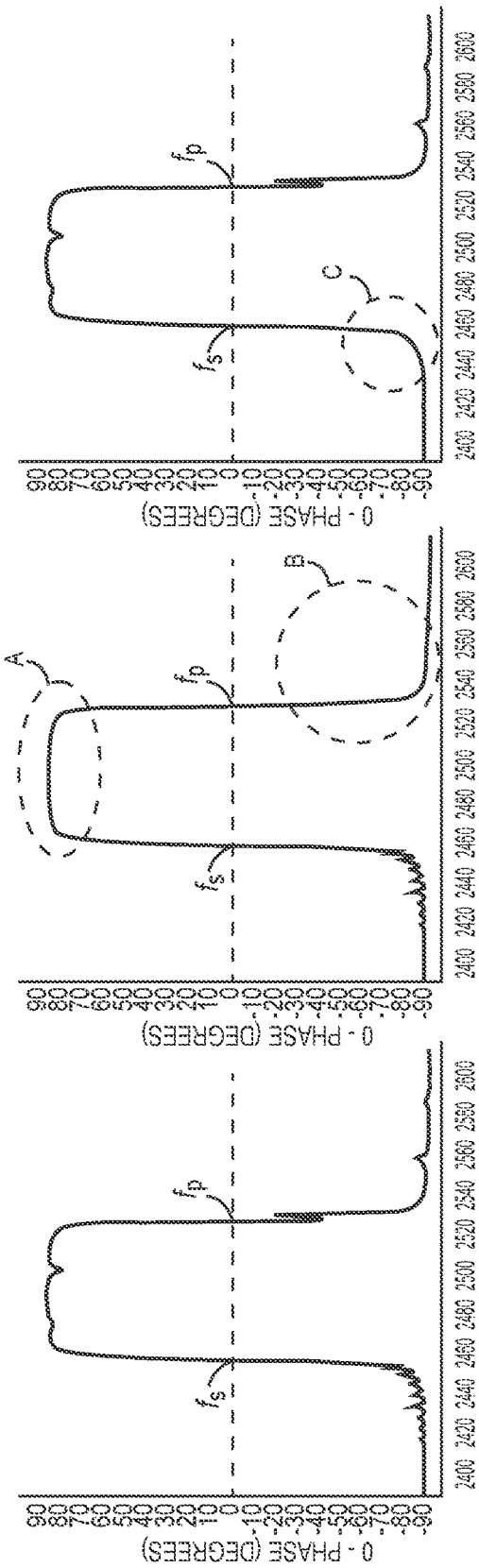
FIGS. 3A-3C are graphs of phase responses for various BAW resonator configurations.
Figure 4:
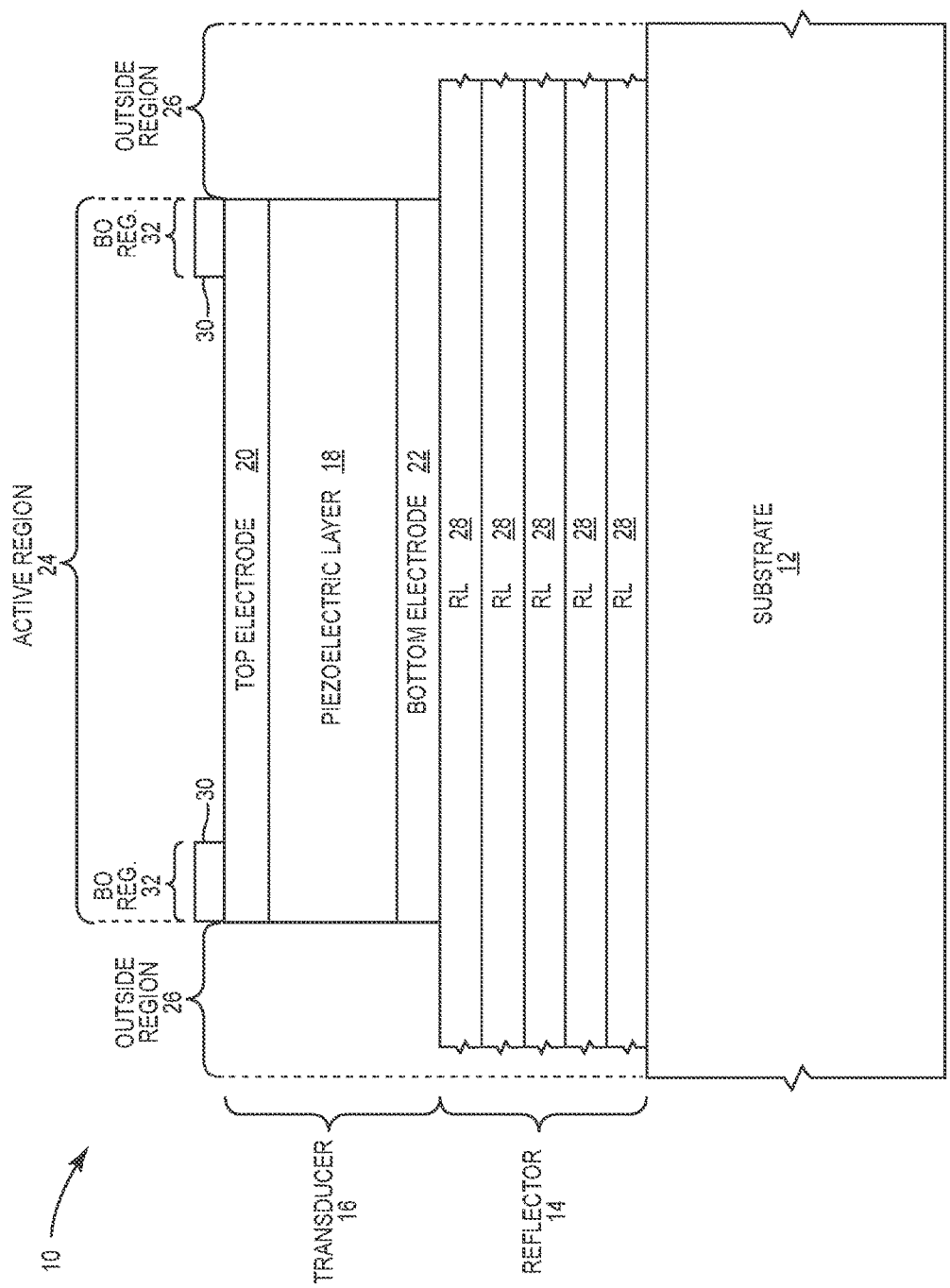
FIG. 4 illustrates a conventional BAW resonator with a border ring.
Figure 5A:
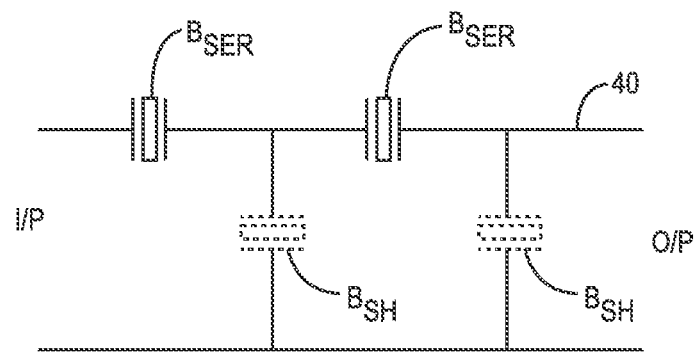
FIG. 5A is a schematic of a conventional ladder network.
Figure 5B:
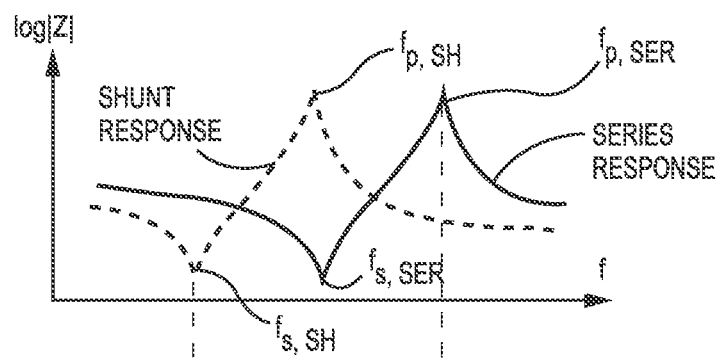
FIGS. 5B and 5C are graphs of a frequency response for BAW resonators in the conventional ladder network of FIG. 5A and a frequency response for the conventional ladder network of FIG. 5A, respectively.
Figure 5C:
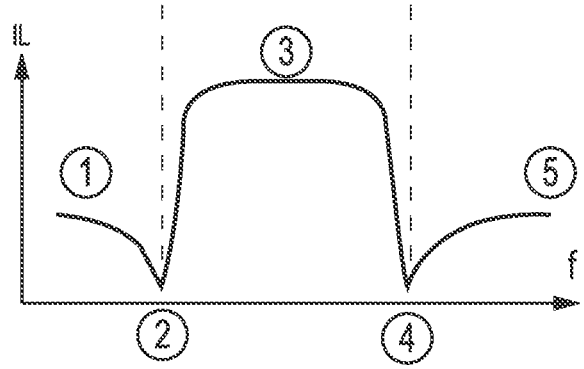
Figure 6A:
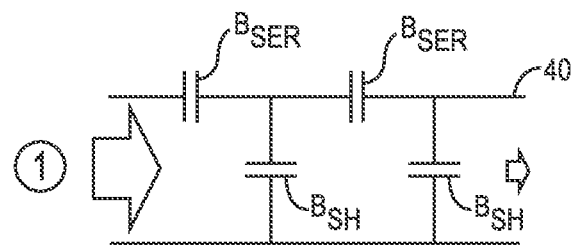
FIGS. 6A-6E are circuit equivalents for the ladder network of FIG. 5A at the frequency points 1, 2, 3, 4, and 5, which are identified in FIG. 5C.
Figure 6B:
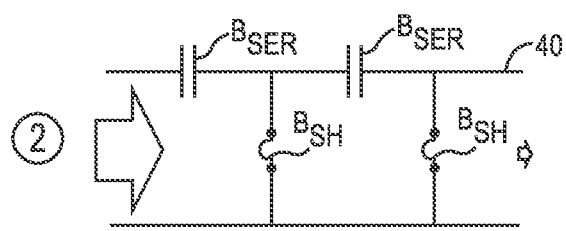
Figure 6C:
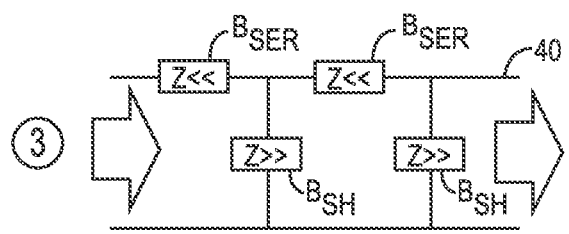
Figure 6D:
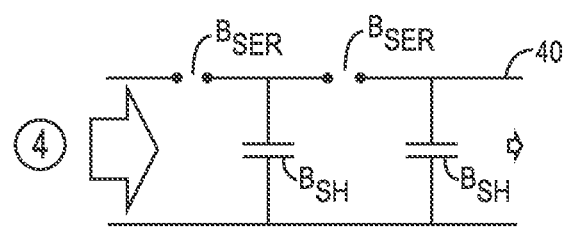
Figure 6E:
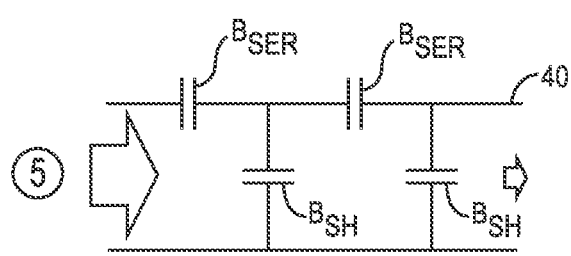
Figure 8:
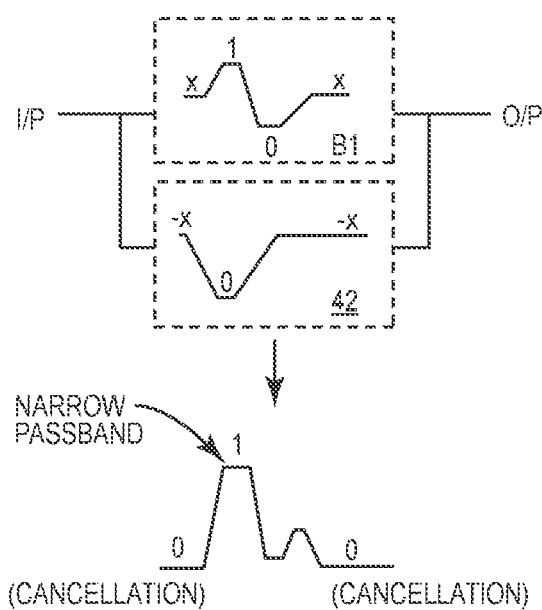
FIG. 8 is a graph that illustrates exemplary frequency responses for the acoustic resonator, compensation circuit, and overall circuit of FIG. 7.

To compensate for at least some of the capacitance of the series resonator B1, the compensation circuit 42 presents itself as a negative capacitance within certain frequency ranges, when coupled in parallel with the series resonator B1. Since capacitances in parallel are additive, providing a negative capacitance in parallel with the (positive) capacitance of the series resonator B1 effectively reduces the capacitance of the series resonator B1. With the compensation circuit 42, the series resonator B1 can actually function as a filter (instead of just a resonator) and provide a passband, albeit a fairly narrow passband, instead of a more traditional resonator response (solid line of FIG. 2). FIG. 8 graphically illustrates the frequency responses of the series resonator B1 (inside the block referenced B1), the compensation circuit 42 (inside the block referenced 42), and the overall circuit in which the compensation circuit 42 is placed in parallel with the series resonator B1. As illustrated, the overall circuit provides a relatively narrow passband. Further detail on this particular circuit topology can be found in the co-assigned U.S. patent application Ser. No. 15/004,084, filed Jan. 22, 2016, now U.S. Pat. No. 9,837,984, titled RF LADDER FILTER WITH SIMPLIFIED ACOUSTIC RF RESONATOR PARALLEL CAPACITANCE COMPENSATION; U.S. patent application Ser. No. 14/757,651, filed Dec. 23, 2015, titled SIMPLIFIED ACOUSTIC RF RESONATOR PARALLEL CAPACITANCE COMPENSATION; and U.S. patent application Ser. No. 15/275,957, filed Sep. 26, 2016, now U.S. Pat. No. 10,097,161, titled COMPENSATION CIRCUIT FOR ACOUSTIC RESONATORS, which are incorporated herein by reference in their entireties.

While beneficial in many applications, the narrow passband of the circuit topology of FIG. 7 has its limitations. With the challenges of modern day communication systems, wider passbands and the ability to provide multiple passbands within a given system are needed. Fortunately, applicants have discovered that certain modifications to this topology provide significant and truly unexpected increases in passband bandwidths and, in certain instances, the ability to generate multiple passbands of the same or varying bandwidths in an efficient and effective manner.

Figure 9:
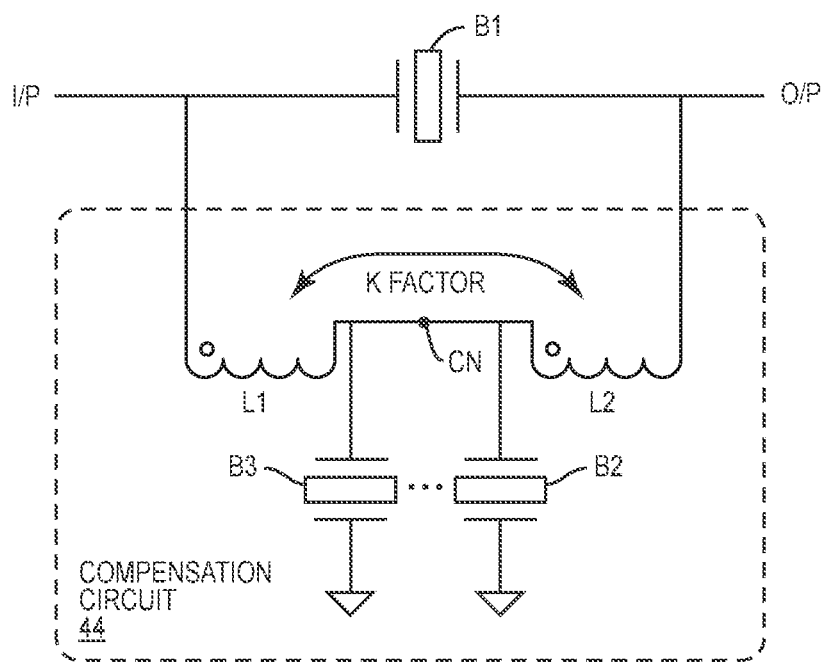
FIG. 9 illustrates an acoustic resonator in parallel with a compensation circuit, which includes at least two shunt acoustic resonators.

With reference to FIG. 9, a modified circuit topology is illustrated wherein the circuit topology of FIG. 7 is modified to include an additional shunt resonator B3, which is coupled between the common node CN and ground. As such, a new compensation circuit 44 is created that includes the negatively coupled inductors L1 and L2, which have a coupling coefficient K, and at least two shunt resonators B2, B3. The compensation circuit 44 is coupled in parallel with the series resonator B1. When the series resonance frequencies $F_s$ of the shunt resonators B2, B3 are different from one another, unexpectedly wide bandwidth passbands are achievable while maintaining very flat passbands, steep skirts, and excellent cancellation of signals outside of the passbands.

Figure 10:
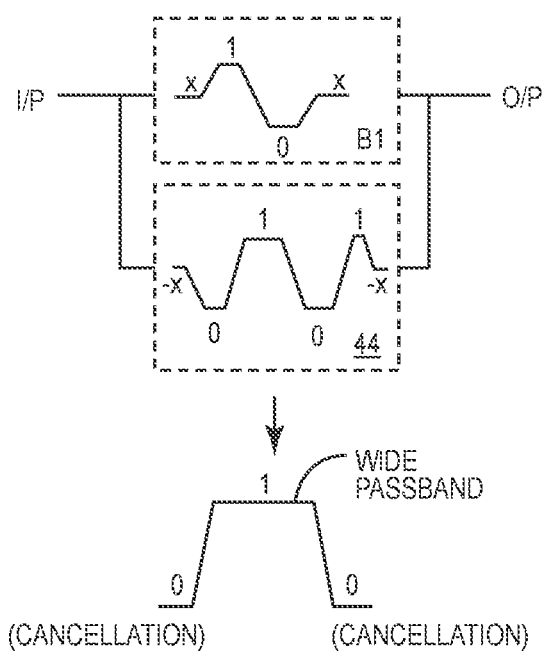
FIG. 10 is a graph that illustrates exemplary frequency responses for the acoustic resonator, compensation circuit, and overall circuit of FIG. 9.

FIG. 10 graphically illustrates the frequency responses of the series resonator B1 (inside the block referenced B1), the compensation circuit 44 (inside the block referenced 44), and the overall circuit in which the compensation circuit 44 is placed in parallel with the series resonator B1. As illustrated, the overall circuit with the compensation circuit 44 provides a much wider passband (FIG. 10) than the overall circuitry with the compensation circuit 42 (FIG. 8).

Figure 11:
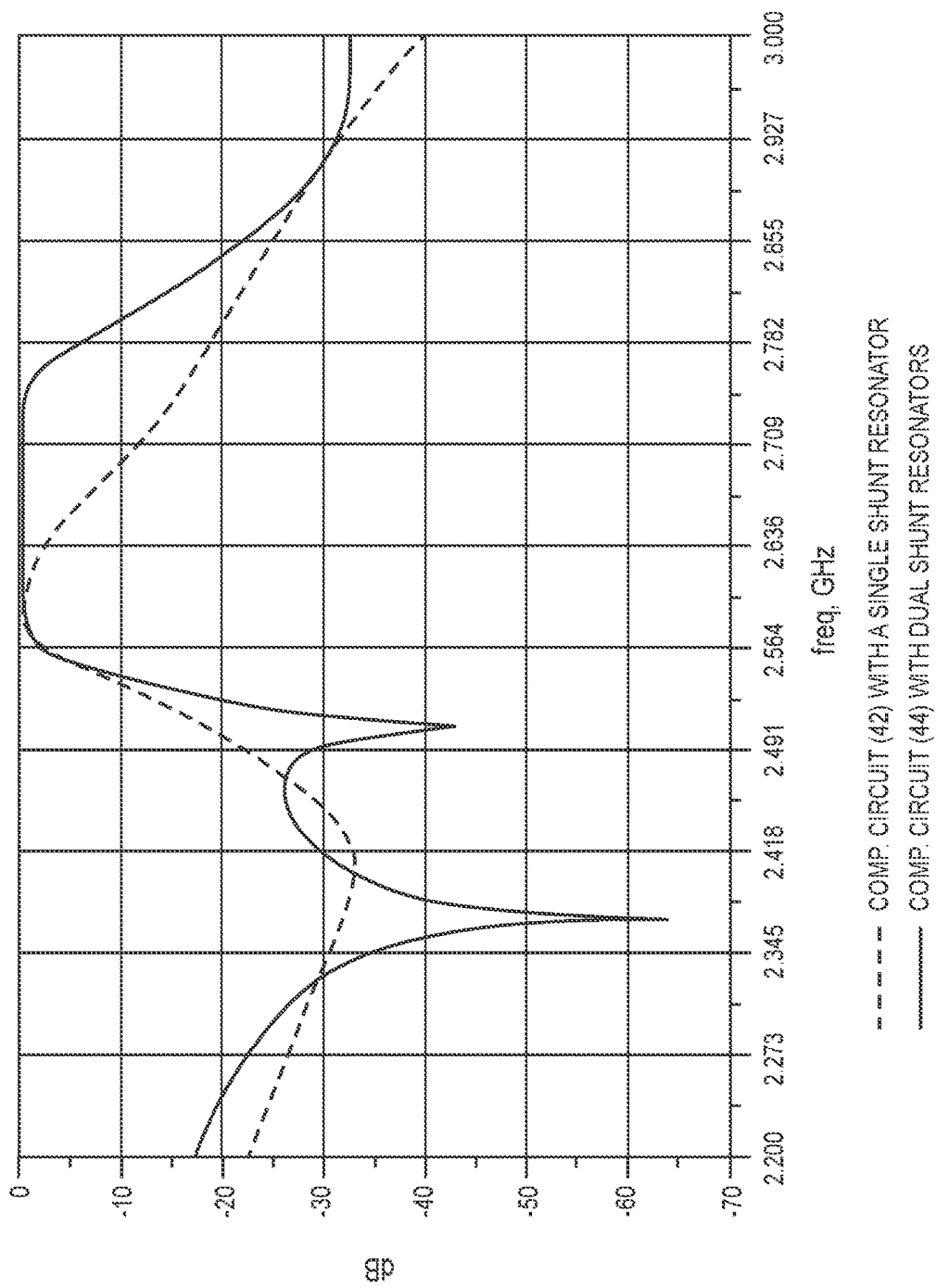
FIG. 11 is a graph that compares actual frequency responses of the overall circuits of FIGS. 7 and 9.

While FIGS. 8 and 10 are graphical representations, FIG. 11 is an actual comparison of the frequency response of the overall circuit using the different compensation circuits 42, 44, wherein the overall circuit using the compensation circuit 44 provides a significantly wider and better formed passband (solid line) than the overall circuit using the compensation circuit 42 (dashed line).

Figure 12:
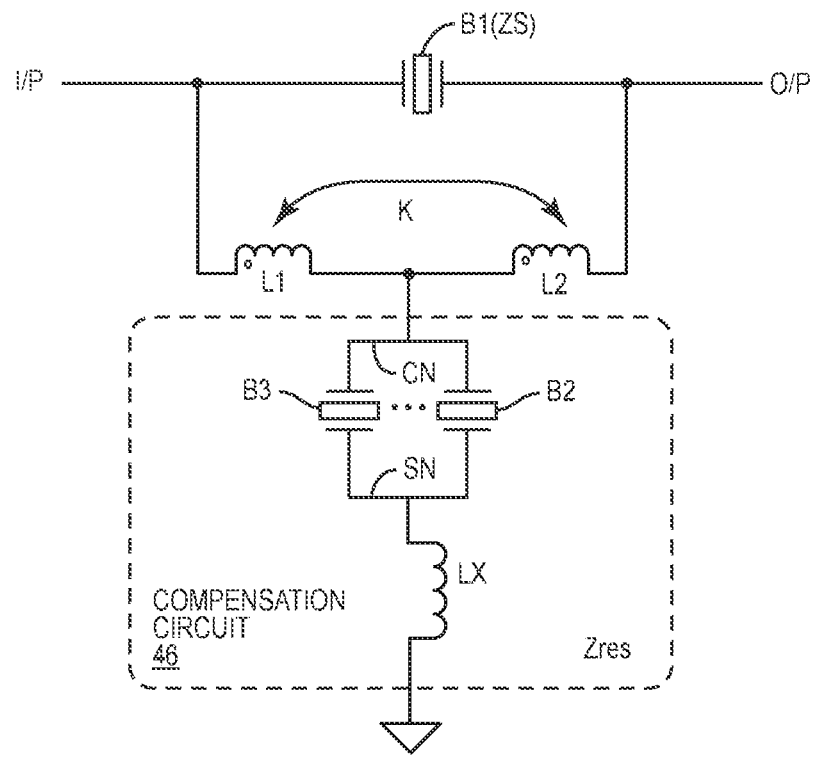
FIG. 12 illustrates an acoustic resonator in parallel with a compensation circuit, which includes at least two shunt acoustic resonators and a shunt inductor, according to one embodiment.

With reference to FIG. 12, a new compensation circuit 46, which facilitates the creation of a wide stopband, as opposed to a passband, is illustrated. The compensation circuit 46 is a modified version of the compensation circuit 44 of FIG. 9, wherein an additional shunt inductor LX is coupled in series with the parallel-coupled, shunt resonators B2, B3 between the common node CN and ground, or other fixed voltage node. As illustrated, the parallel-coupled, shunt resonators B2, B3 are provided between the common node CN and the shunt node SN, and the shunt inductor LX is coupled between the shunt node SN and ground, or other fixed voltage node. However, the shunt inductor LX may be provided between the common node CN and the shunt node SN, and the parallel-coupled, shunt resonators B2, B3 may be provided between the shunt node SN and ground, or other fixed voltage node.

As such, the new compensation circuit 46 includes the negatively coupled inductors L1 and L2, which have a coupling coefficient K, at least two shunt resonators B2, B3, and the shunt inductor LX. As with the previous embodiments, the compensation circuit 46 is coupled in parallel with the series resonator B1. When the series resonance frequencies $F_s$ of the shunt resonators B2, B3 are different from one another, unexpectedly wide stopbands are achievable while maintaining very flat passbands on either side of the stopband, steep skirts, and excellent cancellation of signals inside of the stopband. In one particularly beneficial embodiment, the series resonant frequency $F_S$ of the series resonator B1 is between the series resonant frequencies $F_S$ of the shunt resonators B2, B3.

Figure 13:
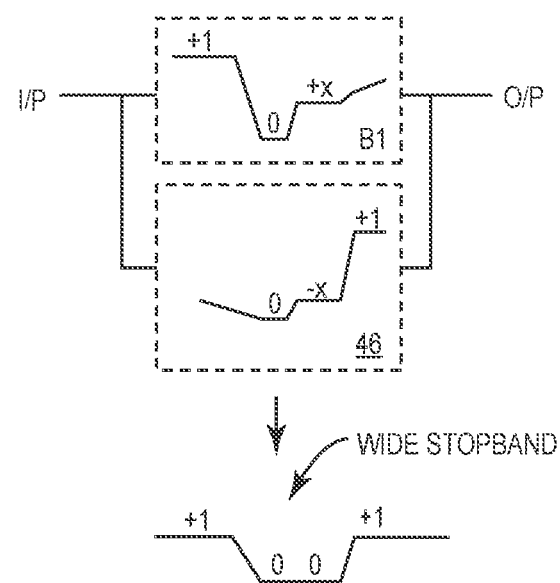
FIG. 13 is a graph that illustrates first exemplary frequency responses for the acoustic resonator, compensation circuit, and overall circuit of FIG. 12.

FIG. 13 graphically illustrates the frequency responses of the series resonator B1 (inside the block referenced B1), the compensation circuit 46 (inside the block referenced 46), and the overall circuit in which the compensation circuit 46 is placed in parallel with the series resonator B1. As illustrated, the overall circuit with the compensation circuit 46 provides a wide stopband (FIG. 13), which is essentially the inverse of the passband response provided when the compensation circuit 44 that does not include the shunt inductor LX is employed (FIG. 10).

Figure 14:
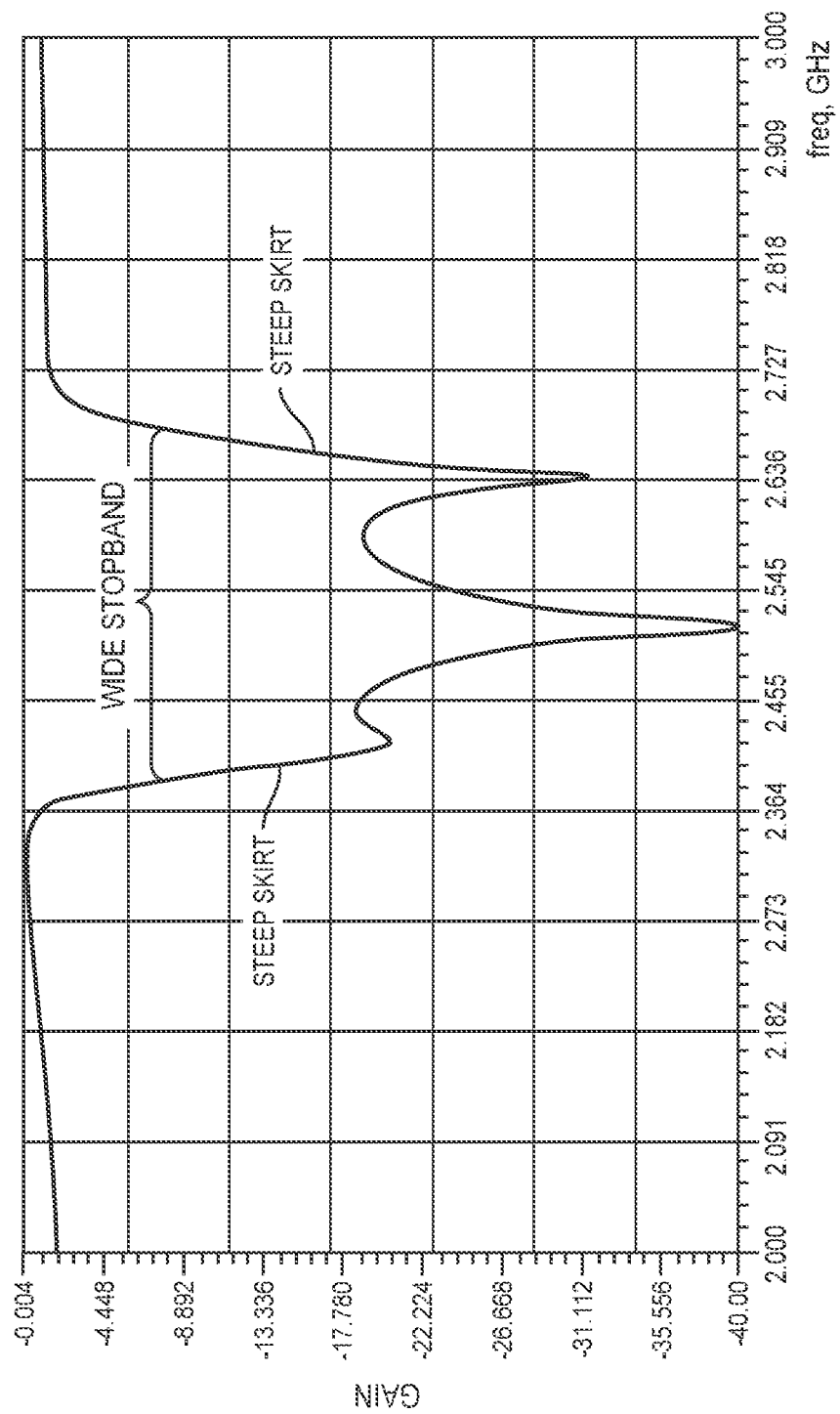
FIG. 14 is a graph of the actual frequency response for the overall circuit of FIG. 12.

While FIG. 13 is a graphical representation of the stopband provided when the compensation circuit 46 is employed, FIG. 14 is an actual frequency response when the compensation circuit 46 is employed. In this example, the series resonance frequency $F_S$ of the series resonator B1 is 2347 MHz; the series resonance frequency $F_S$ of the shunt resonator B2 is 2304 MHz; and the series resonance frequency $F_S$ of the shunt resonator B2 is 2590 MHz. Shunt inductor LX is 5 nH. The overall frequency (gain) response with this configuration provides a broadband bandstop response from 2400 MHz to 2690 MHz, which is impressively and approximately 300 MHz wide. Signals are passed below 2358 MHz and above 2714 MHz.

Figure 15:
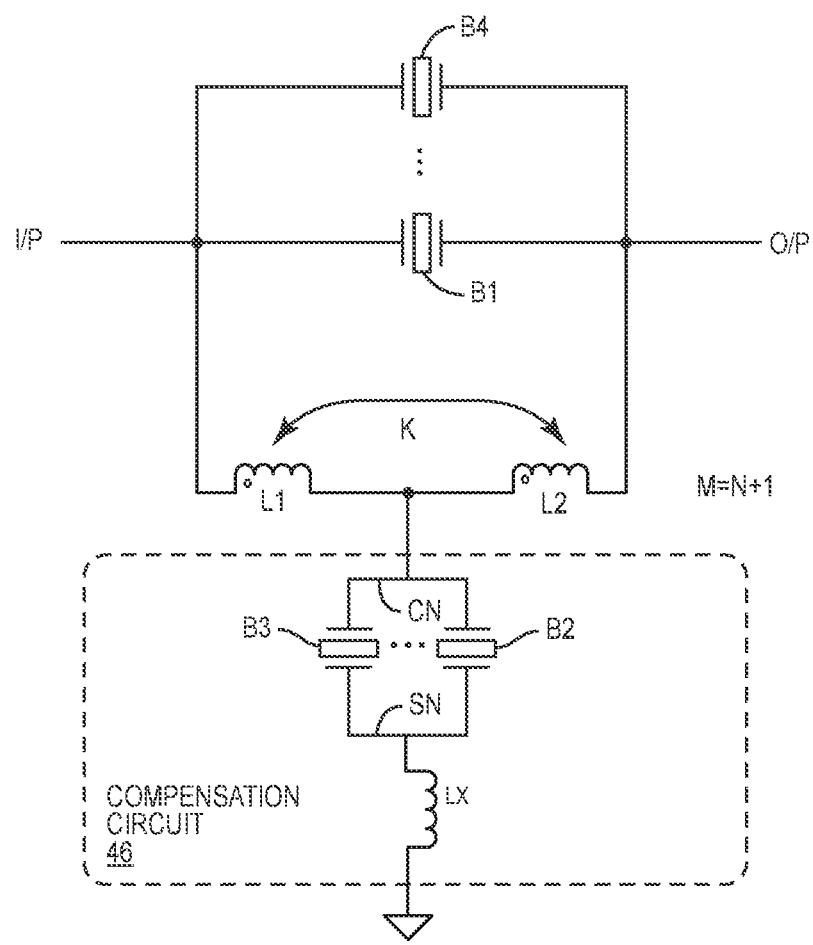
FIG. 15 illustrates a plurality of parallel acoustic resonators in parallel with a compensation circuit, which includes at least two shunt acoustic resonators and a shunt inductor, according to one embodiment

As illustrated in FIG. 15, the concepts described herein not only contemplate the use of two or more shunt resonators B2, B3, which are coupled between the common node CN and ground, but also multiple series resonators. For example, series resonators B1 and B4 may be coupled in parallel with one another between the input node I/P and the output node O/P. In certain embodiments, the series resonance frequencies $F_s$ of the series resonators B1, B4 are different from one another, and the series resonance frequencies $F_s$ of the shunt resonators B2, B3 are also different from one another and different from those of the series resonators B1, B4. While only two series resonators B1, B4 and two shunt resonators B2, B3 are illustrated, any number of these resonators may be employed depending on the application and the desired characteristics of the overall frequency response of the circuit in which these resonators and associated compensation circuits 46 are employed. In one embodiment, there are more series resonators (i.e. B1, B4) than shunt resonators (i.e. B2, B3). In yet another embodiment, there are multiple series resonators (i.e. B1, B4) and multiple shunt resonators (i.e. B2, B3) wherein there is one more shunt resonator (i.e. B2, B3) than there are series resonators (i.e. B1, B4).

For various embodiments, stopbands of greater than 25 MHz, 50 MHz, 100 MHz, 150 MHz, 175 MHz, 200 MHz, and 250 MHz are contemplated at frequencies at or above 1.5 GHz, 1.75 GHz, 2 GHz, and 2.5 GHz. In other words, center-frequency-to-bandwidth ratios (fc/BW*100) of 3.5% to 9%, 12%, or greater are possible, wherein fc is the center frequency of the stopband and BW is the bandwidth of the stopband. If multiple stopbands are provided, BW may encompass all of the provided stopbands. Further, when multiple stopbands are provided, the stopbands may have the same or different bandwidths or center-frequency-to-bandwidth ratios. For example, one stopband may have a relatively large center frequency to bandwidth ratio, such as 12%, and a second stopband may have a relatively small center frequency to bandwidth ratio, such as 2%. Alternatively, multiple ones of the stopbands may have a bandwidth of 100 MHz, or multiple ones of the stopbands may have generally the same center-frequency-to-bandwidth ratios. In the latter case, the bandwidths of the stopbands may inherently be different from one another, even though the center-frequency-to-bandwidth ratios are the same.

Figure 16A:
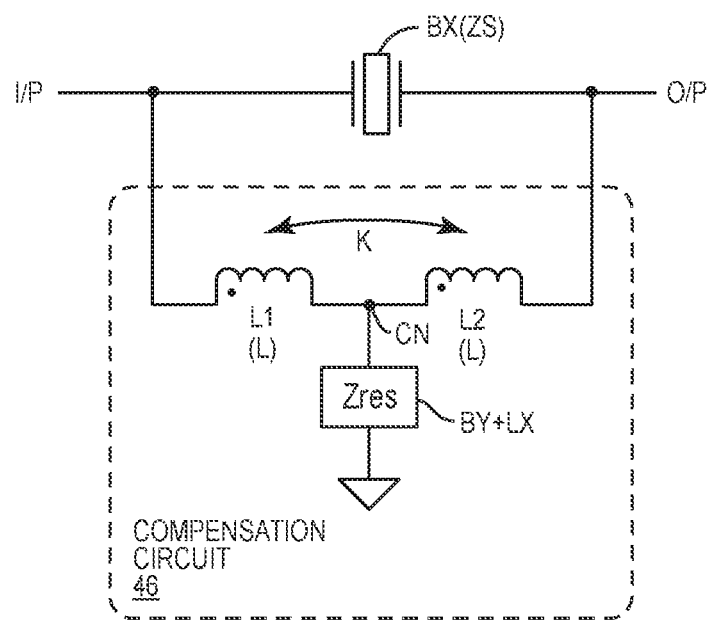
FIGS. 16A through 16D illustrate transformation of the T-circuit impedance architecture of the compensation circuit of FIG. 12 to a π (pi) impedance model.

The theory of the compensation circuit 46 follows and is described in association with FIGS. 16A through 16D and 17. With reference to FIG. 16A, assume the compensation circuit 46 includes the two negatively coupled inductors L1, L2, which have an inductance value L, two or more shunt resonators BY, and the shunt inductor LX. The two or more shunt resonators BY and the shunt inductor LX combine to provide an overall shunt impedance Zres presented between the common node CN and ground. While the inductance values L of the negatively coupled inductors L1, L2 are described as being the same, these values may differ depending on the application. Also assume that the one or more series resonators BX present an overall series impedance ZS.

Figure 16B:
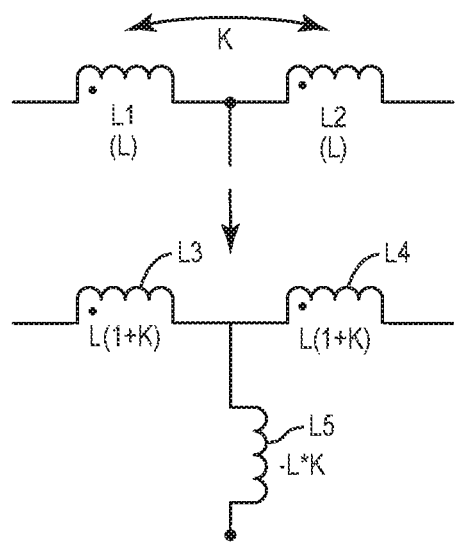
Figure 16C:
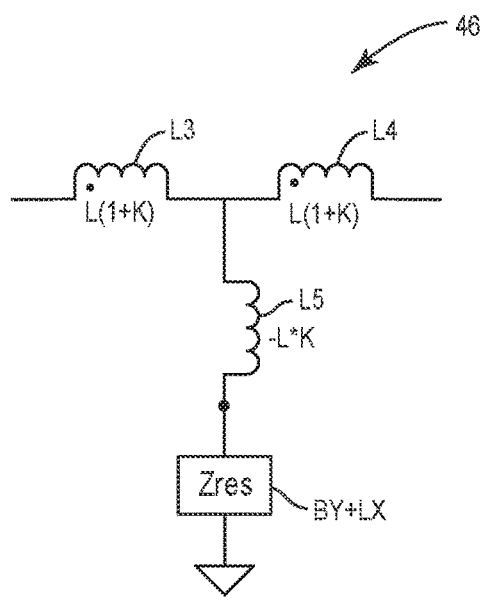

As shown in FIG. 16B, the two negatively coupled and series-connected inductors L1, L2 (without Zres) can be modeled as a T-network of three inductors L3, L4, and L5, wherein series inductors L3 and L4 are connected in series and have a value of $L(1+K)$, and shunt inductor L5 has a value of $-L*K$, where K is a coupling factor between the negatively coupled inductors L1, L2. Notably, the coupling factor K is a positive number between 0 and 1. Based on this model, the overall impedance of the compensation circuit 46 is modeled as illustrated in FIG. 16C, wherein the shunt impedance Zres is coupled between the shunt inductor L5 and ground. The resulting T-network, as illustrated in FIG. 16C, can be transformed into an equivalent π (pi) network, as illustrated in FIG. 16D.

Figure 16D:
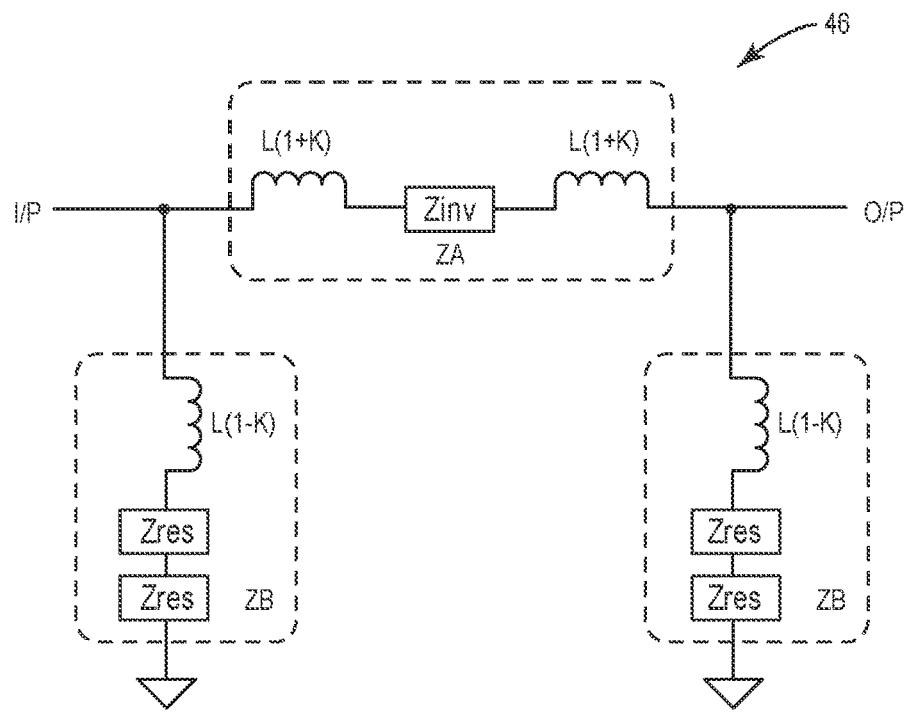

The π network of FIG. 16D can be broken into a series impedance ZA and two shunt equivalent impedances ZB. The series equivalent impedance ZA is represented by two series inductances of value $L(1+K)$, where $K>0$, and a special "inversion" impedance Zinv. The inversion impedance Zinv is equal to $[L(1+K)\omega]^2/[Zres-jLK\omega]$, where $\omega=2\pi f$ and f is the frequency. As such, the series equivalent impedance ZA equals $j*2*L(1+K)\omega+Zinv$ and is coupled between the input node I/O and the output node O/P. Each of the two shunt equivalent impedances ZB is represented by an inductor of value $L(1-K)$ in series with two overall shunt impedances Zres.

Figure 17:
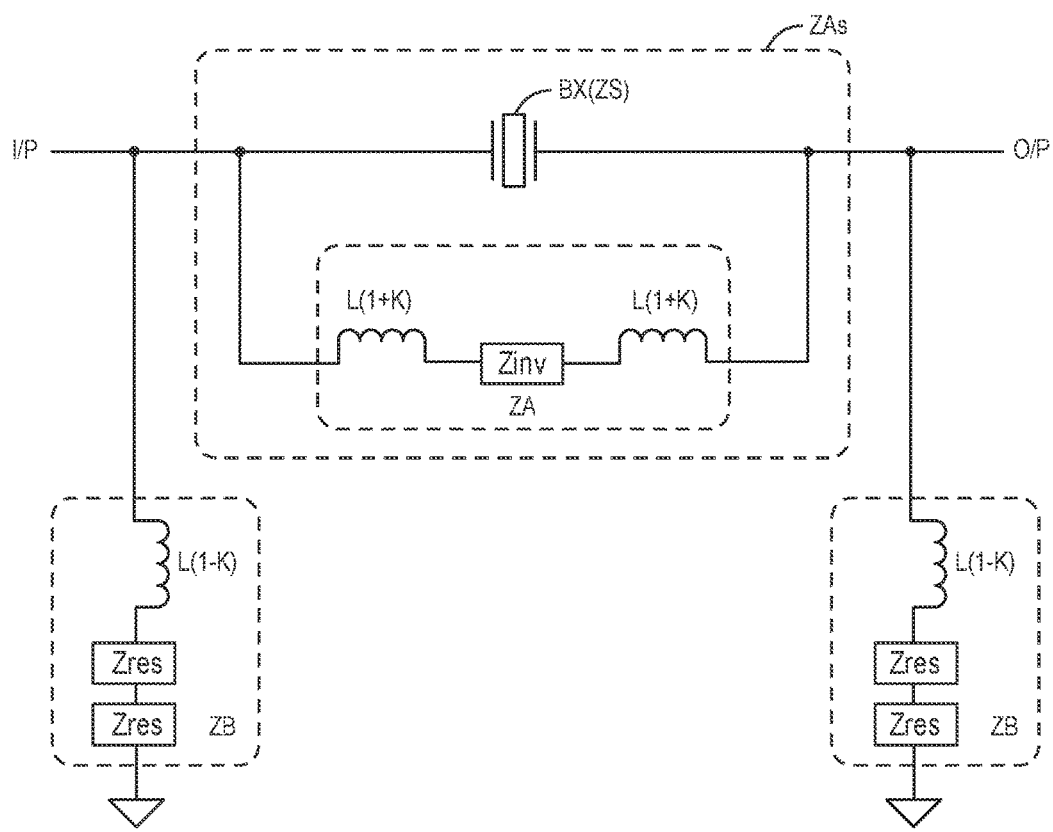
FIG. 17 illustrates the overall circuit of FIG. 12 using the π (pi) impedance model of FIG. 16D.

FIG. 17 illustrates the series impedance ZS of the series resonators BX in parallel with the series equivalent impedance ZA of the compensation circuit 46. The overall series impedance ZAs represents the series impedance ZS in parallel with the series equivalent impedance ZA. The two shunt impedances ZB are respectively coupled between the input port I/P and ground and the output port O/P and ground. The following discussion relates to the series equivalent impedance ZA and its impact on the series impedance ZS when the series equivalent impedance ZA is placed in parallel with the series impedance ZS, as well as the impact of the shunt impedances ZB.

Figure 18:
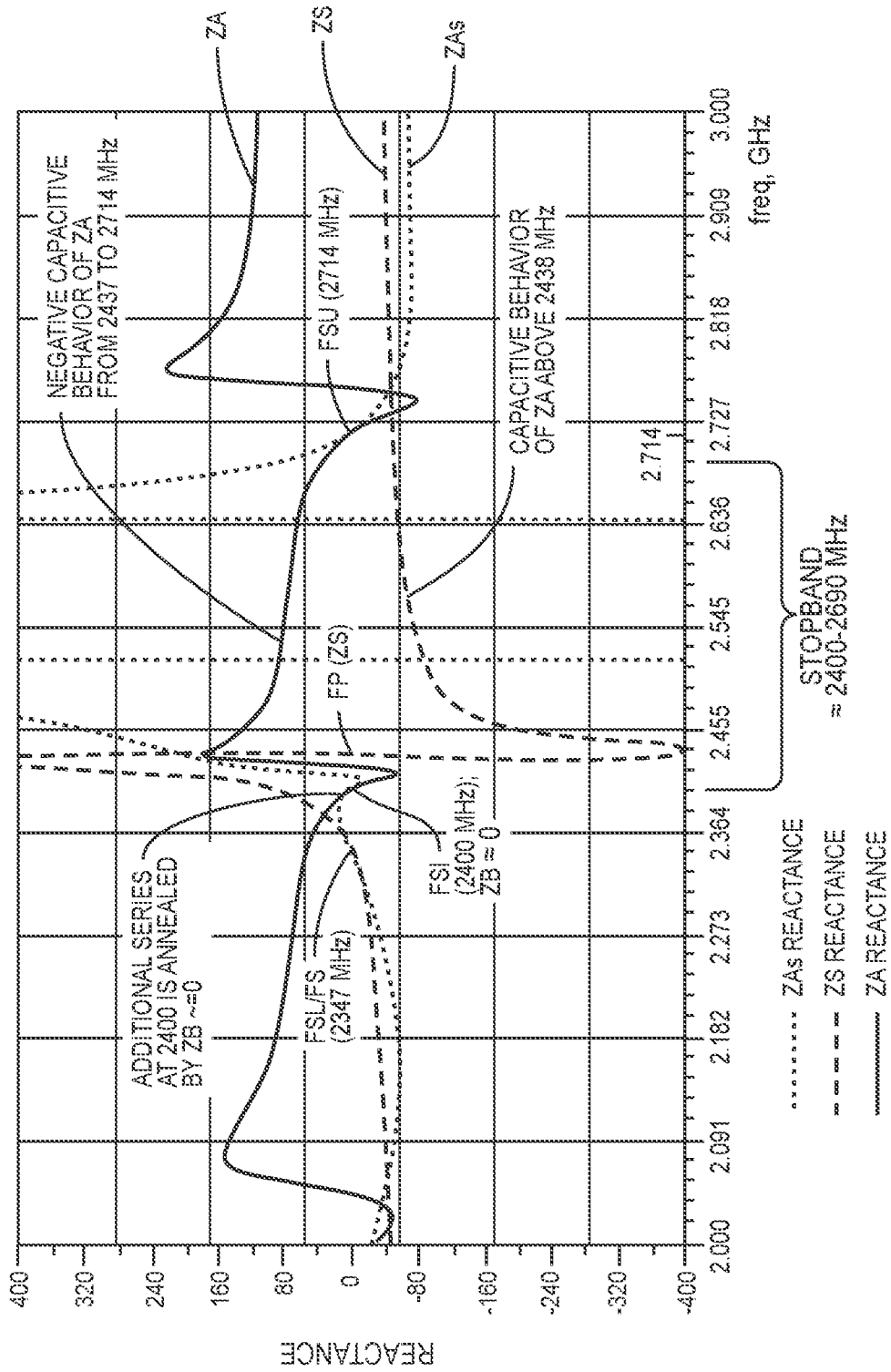
FIG. 18 is a graph illustrating various reactances according to one embodiment.
Figure 19:
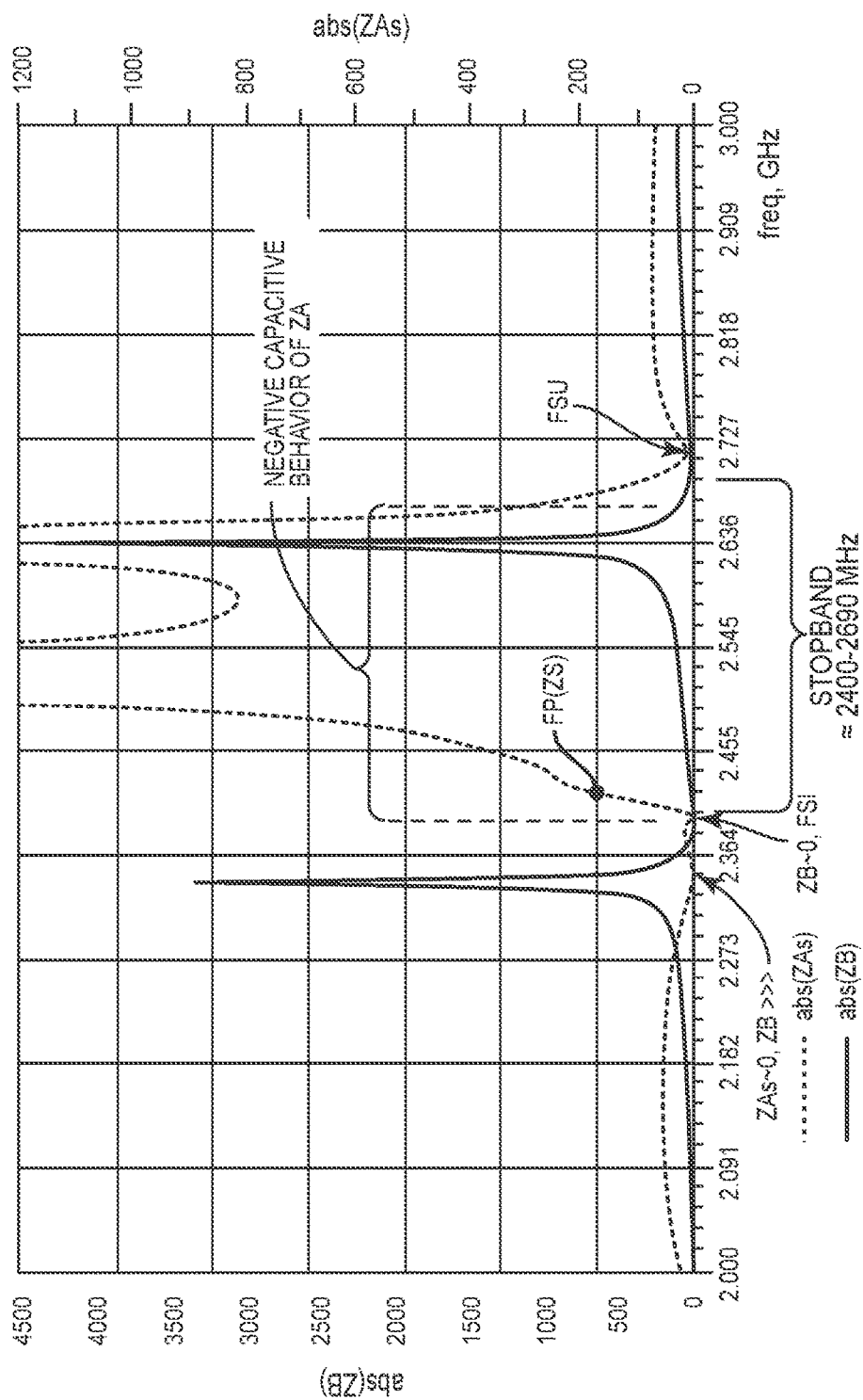
FIG. 19 is a graph illustrating various impedances according to one embodiment.

FIGS. 18 and 19 are used to illustrate the detailed operation and configuration of the compensation circuit 46 according to one embodiment. The illustrated embodiment corresponds to the stopband featured in the above-described FIG. 14. In particular, FIG. 18 is a graph of the reactance for the series impedance ZS, the series equivalent impedance ZA, and the overall series impedance ZAs. FIG. 19 is a graph of the magnitude of the impedances for the overall series impedance ZAs and shunt impedance ZB. For this example, the stopband extends from approximately 2400 MHz to 2690 MHz to provide a stopband bandwidth of about 300 MHz, wherein frequencies less than about 2358 MHz and above about 2714 MHz are passed.

In this embodiment, the compensation circuit 46 provides a series equivalent impedance ZA in parallel with the series impedance ZS of the at least one series resonator B1. The compensation circuit 46 also provides the two shunt impedances ZB between the input node I/P and ground and the output node O/P and ground, respectively. In operation, the series equivalent impedance ZA provides a phenomenon referred to as a "negative capacitive behavior" throughout most of the frequencies at which broadband cancellation is desired and provides at least two additional series resonances between the input node I/P and the output node O/P. The shunt impedance ZB provides series resonance to ground, or other fixed voltage node, at or near the lower edge of the desired stopband. The series resonances and their interplay are described in detail below.

The series impedance ZS of the at least one series resonator B1 will provide at least one series resonance at a series resonance frequency FS, which will be referred to below as the lower resonance frequency FSL. The lower resonance frequency FSL falls between the series resonance frequency FS-shunt1 of the shunt resonator B2, which is 2304 MHz in this example, and the series resonance frequency FS-shunt2 of shunt resonator B3, which is 2590 MHz in this example. When placed in parallel with the series impedance ZS of the series resonator B1, the series equivalent impedance ZA causes the overall series impedance ZAs to have at least two series resonances in addition to the lower series resonance FSL between the input node I/O and the output node O/P, as shown in FIGS. 18 and 19. As such, the overall series impedance ZAs provides at least three series resonances.

The first series resonance is at the series resonance frequency FS of the series impedance ZS, which as noted above, is referred to as the lower resonance frequency FSL. The lower resonance frequency FSL falls just below the desired stopband. The second series resonance is referred to as an upper series resonance and occurs at an upper resonance frequency FSU, which falls just above the stopband. The third series resonance is referred to as an intermediate series resonance and occurs at an intermediate resonance frequency FSI, which is between the lower resonance frequency FSL and the upper resonance frequency FSU. The intermediate and upper series resonances are provided through the compensation circuit 46 and induced by the series equivalent impedance ZA. In this example, the lower resonance frequency FSL is approximately 2347 MHz, the intermediate resonance frequency FSI is approximately 2400 MHz, and the upper resonance frequency FSU is approximately 2714 MHz, wherein the stopband extends from approximately 2400 MHz to 2690 MHz. The parallel resonance frequency FP of the series resonator B1 is approximately 2428 MHz.

While the lower and upper series resonances at the lower resonance frequency FSL and the upper resonance frequency FSU function to provide respective resonances between the input node I/P and the output node O/P, the series resonance of the shunt equivalent impedance ZB is located to essentially negate the intermediate series resonance at the intermediate resonance frequency FSI. In essence, a short is provided between the input and output nodes I/P, O/P and ground through the compensation circuit 46 at or near the intermediate resonance frequency FSI. As such, signals at or near the intermediate resonance frequency FSI will not pass from the input node I/P to the output node O/P, even though there is a resonance therebetween. In one embodiment, the components of the compensation circuit 46, including the inductor LX, are selected such that the series resonance frequency of the shunt equivalent impedance ZB is within at least one to two percent (1-2%) of the intermediate resonance frequency FSI.

The compensation circuit 46 tends to increase the effective reactance of the series impedance ZS throughout a significant portion of the stopband by providing the negative capacitive behavior, which functions to cancel the natural capacitance provided by the series impedance ZS. The extent of the negative capacitive behavior provided by the series equivalent impedance ZA is a direct function of the inductance value of inductor LX. When the series resonator B1 and the compensation circuit 46 are configured such that the lower resonance frequency FSL falls between the series resonance frequency FS-shunt1 of the shunt resonator B2 and the series resonance frequency FS-shunt2 of shunt resonator B3, the negative capacitive behavior occurs throughout a significant portion of the desired stopband.

To help explain the benefits and concept of the negative capacitive behavior provided by the series equivalent impedance ZA, normal capacitive behavior is described in association with the series impedance ZS, which is provided by the series resonator B1. FIG. 18 graphs the imaginary component, or reactance, of the series impedance ZS.

Whenever the imaginary component of the series impedance ZS is less than zero, the series resonance of ZS exhibits a "normal" capacitive behavior. The capacitive behavior is characterized in that the reactance of the series impedance ZS is negative and decreases in magnitude as frequency increases, which is consistent with normal capacitive reactance. Capacitive reactance is represented by $1/j\omega C$. The graph of FIG. 18 shows multiple regions within the impedance response of the series impedance ZS that exhibit unusual capacitive behavior. The focus at this point will be on the region that starts just above the parallel resonance frequency FP of the series impedance ZS and extends to the upper end of the graph (i.e. above 2438 MHz). As illustrated, this region exhibits capacitive behavior in that the reactance is negative and decreases in magnitude as frequency increases.

Continuing with FIG. 18, the series equivalent impedance ZA is also illustrated over the same frequency range as that of the series impedance ZS. Interestingly, the reactance of the series equivalent impedance ZA is somewhat inverted with respect to that of the series impedance ZS between the parallel resonance frequency FP of the series impedance ZS until a point just below the zero crossing for the series equivalent impedance ZA. Throughout this range, which envelopes most of the stopband, the reactance of the series equivalent impedance ZA is both positive and decreases in magnitude as frequency increases. Having a reactance that decreases in magnitude as frequency increases is generally indicative of capacitive behavior. However, in this instance, the reactance is positive, whereas normal capacitive behavior would present a negative reactance. As such, those portions of the series equivalent impedance ZA that decrease in magnitude as frequency increases and have a positive reactance exhibit "negative capacitive behavior."

The negative capacitive behavior of the series equivalent impedance ZA for the compensation circuit 46 is important, because when the series equivalent impedance ZA is placed in parallel with the series impedance ZS, the effective capacitance of the overall circuit is reduced, especially in the stopband when the compensation circuit 46 is configured as described above.

In general, the stopband response of the overall circuit is defined by a stopband between a lower passband and an upper passband. Frequencies below the lower resonance frequency FSL and above the upper resonance frequency FSU are passed. The intermediate resonance frequency FSI in the series resonance for the shunt equivalent impedance ZB are located sufficiently close to one another such that the series resonance for the shunt equivalent impedance CB effectively negates the intermediate resonance frequency FSI. The series resonance for the shunt equivalent impedance ZB essentially defines the lower end of the stopband. A point just below the upper resonance frequency FSU defines the upper end of the stopband.

For a particularly effective embodiment, the lower resonance frequency FSL is set to fall between the series resonance (FS-shunt1) of the shunt resonator B2 and the series resonance (FS-shunt2) of shunt resonator B3. The series impedance ZS of the series resonator B1 provides a lower series resonance (FSL) below the desired stopband. The series equivalent impedance ZA of the compensation circuit 46 adds at least an upper series resonance (FSU) and an intermediate series resonance (FSI), which is between the lower series resonance (FSL) and the upper series resonance (FSU). The upper series resonance (FSU) is just above the stopband, and the intermediate series resonance (FSI) is within the stopband. However, the intermediate series resonance provided by the series equivalent impedance ZA is essentially negated by the series resonance of the shunt equivalent impedance ZB, which is generally located within the intermediate series resonance. Further, the intermediate series resonance of the series equivalent impedance ZA is near the parallel resonance frequency of ZS. In select embodiments, the series equivalent impedance ZA exhibits negative capacitive behavior throughout a majority, and perhaps at least 70-75% or more, of the stopband, and series impedance ZS exhibits capacitive behavior throughout a majority, and perhaps at least 70-75% or more, of the stopband. The series equivalent impedance ZA and the series impedance ZS have opposite reactance polarity (opposite signs) and roughly the same magnitudes (ZA within 30% of ZS) throughout at least a majority, if not at least 70% of the stopband. In one embodiment, the value of the shunt inductor LX is chosen such that the intermediate resonance frequency FSI is near the series resonance frequency FS of the series resonator B1.

Figure 20:
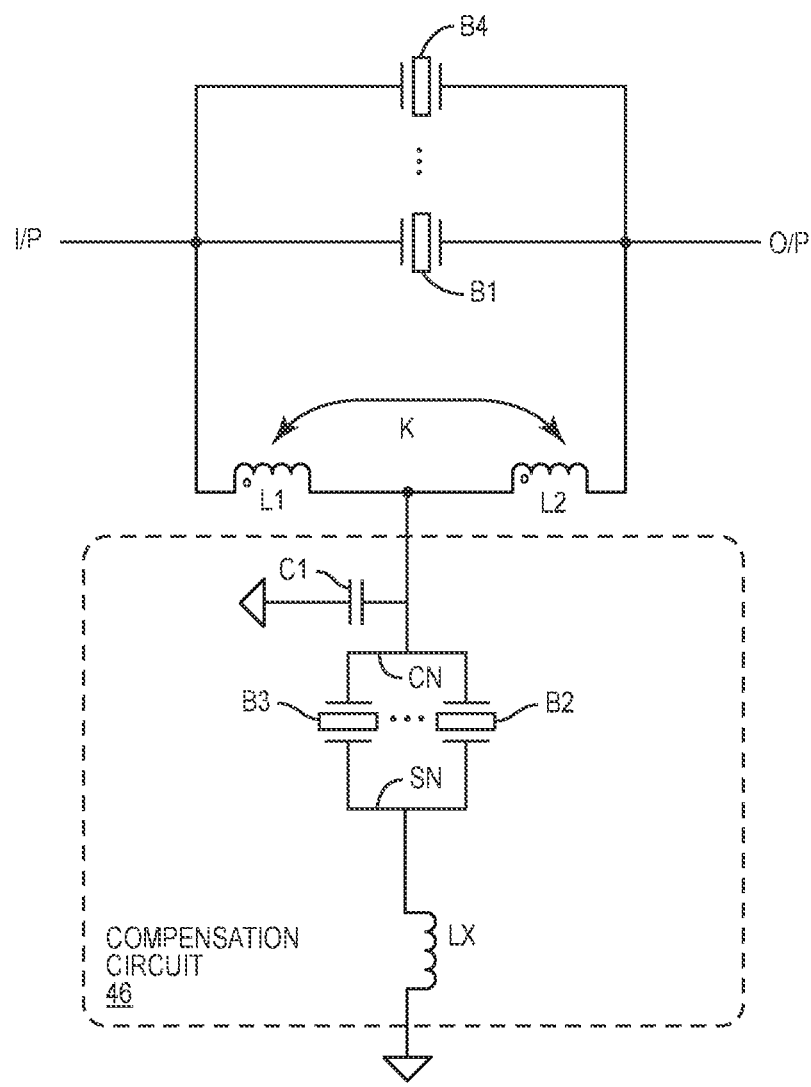
FIG. 20 illustrates parallel-coupled acoustic resonators in parallel with a compensation circuit, which includes at least one capacitor, according to a second embodiment.
Figure 21:
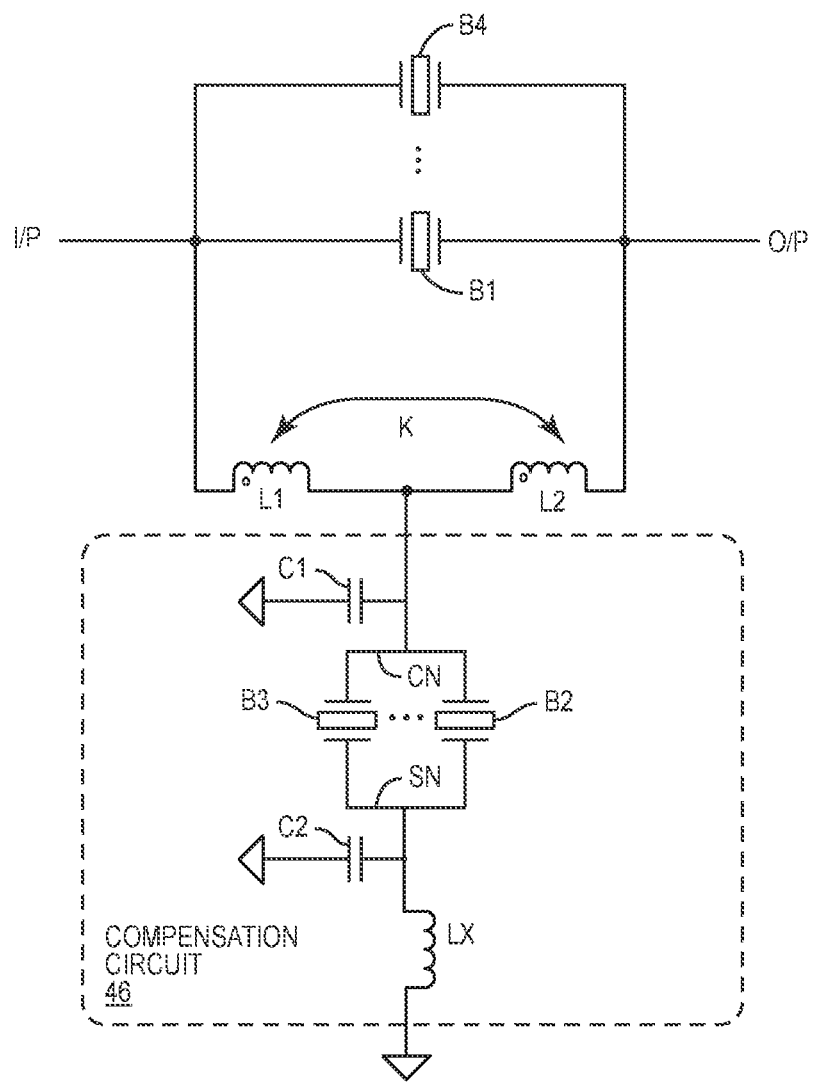
FIG. 21 illustrates parallel-coupled acoustic resonators in parallel with a compensation circuit, which includes at least one capacitor, according to a third embodiment.

Various modifications are envisioned for the circuitry described above. For example, FIG. 20 illustrates the inclusion of capacitor C1, and FIG. 21 illustrates the inclusion of capacitors C1 and C2. Capacitor C1 is coupled between the common node CN and ground, or other fixed voltage node, and capacitor C2 is coupled between the parallel shunt acoustic resonators B1, B2 and the inductor LX. These capacitors C1, C2 may be used to help adjust the overall capacitance or negative capacitive behavior associated with the compensation circuit 46.

The bandstop technology described above is useful in many applications. For example, a bandstop may be used as an antenna aperture bandstop for a first antenna to reflect undesired frequencies from a second antenna that is near the first antenna. In another example, the bandstop technology may be used in an antenna multiplexer. For example, the antenna multiplexer may provide a bandpass to pass wireless local area network (WLAN) 2.4 GHz (i.e. 2400-2500 MHz) and a bandstop at WLAN to pass other cellular frequencies such as 1710-2200 MHz, 2200-2400 MHz, and 2500-2700 MHz. Further, the bandstop filter may be used instead of a multiple-N receive multiplexer for a high-band diversity path, as long as the bandstop can reject the transmit frequencies by at least 30 decibels (dB).

Those skilled in the art will recognize numerous modifications and other embodiments that incorporate the concepts described herein. These modifications and embodiments are considered to be within scope of the teachings provided herein and the claims that follow.

What is claimed is:

1. Filter circuitry comprising:
    an input node and an output node;
    at least one series acoustic resonator coupled between the input node and the output node, wherein at least one main series resonance is provided between the input node and the output node at a main resonance frequency through the at least one series acoustic resonator; and
    a compensation circuit comprising:
        a first inductor and a second inductor coupled in series between the input node and the output node, wherein the first inductor and the second inductor are negatively coupled with one another and a common node is provided between the first inductor and the second inductor;
        a shunt circuit coupled between the common node and a fixed voltage node and comprising a shunt inductor coupled in series with a plurality of parallel-coupled shunt acoustic resonators, which comprises a first shunt acoustic resonator coupled in parallel with a second shunt acoustic resonator, wherein a transfer function of the filter circuitry between the input node and the output node provides a frequency response with a stopband between two passbands.

2. The filter circuitry of claim 1 wherein the compensation circuit provides an upper series resonance between the input node and the output node at an upper resonance frequency, such that the main resonance frequency is below the stopband and the upper resonance frequency is above the stopband.

3. The filter circuitry of claim 2 wherein the compensation circuit further provides an intermediate series resonance between the input node and the output node at an intermediate resonance frequency, which is between the main resonance frequency and the upper resonance frequency.

4. The filter circuitry of claim 3 wherein the first shunt acoustic resonator has a first series resonance at a first resonance frequency, the second shunt acoustic resonator has a second series resonance at a second resonance frequency, and the main resonance frequency is between the first resonance frequency and the second resonance frequency.

5. The filter circuitry of claim 1 wherein the first shunt acoustic resonator has a first series resonance at a first resonance frequency, the second shunt acoustic resonator has a second series resonance at a second resonance frequency, and the main resonance frequency is between the first resonance frequency and the second resonance frequency.

6. The filter circuitry of claim 1 wherein the at least one series acoustic resonator comprises a plurality of parallel-coupled series acoustic resonators that are coupled in parallel with one another and each of the plurality of parallel-coupled series acoustic resonators has a different resonance frequency.

7. The filter circuitry of claim 6 wherein the plurality of parallel-coupled shunt acoustic resonators further comprises at least one additional shunt acoustic resonator coupled in parallel with the first shunt acoustic resonator and the second shunt acoustic resonator.

8. The filter circuitry of claim 7 wherein a number of resonators of the plurality of parallel-coupled series acoustic resonators is less than a number of resonators of the plurality of parallel-coupled shunt acoustic resonators.

9. The filter circuitry of claim 1 wherein the compensation circuit comprises at least one additional shunt acoustic resonator coupled in parallel with the first shunt acoustic resonator and the second shunt acoustic resonator.

10. The filter circuitry of claim 1 wherein:
    an equivalent $\pi$ (pi) network of the compensation circuit comprises a series equivalent impedance between the input node and the output node and two shunt equivalent impedances; and
    the series equivalent impedance exhibits negative capacitive behavior throughout a majority of the stopband.

11. The filter circuitry of claim 10 wherein the at least one series acoustic resonator provides a main impedance that exhibits capacitive behavior throughout the majority of the stopband.

12. The filter circuitry of claim 11 wherein the series equivalent impedance exhibits the negative capacitive behavior throughout at least 70% of the stopband.

13. The filter circuitry of claim 12 wherein the main impedance exhibits the capacitive behavior throughout at least 70% of the stopband.

14. The filter circuitry of claim 10 wherein the series equivalent impedance exhibits the negative capacitive behavior throughout at least 70% of the stopband.

15. The filter circuitry of claim 10 wherein:
    the compensation circuit provides an upper series resonance between the input node and the output node at an upper resonance frequency, such that the main resonance frequency is below the stopband and the upper resonance frequency is above the stopband;
    the compensation circuit further provides an intermediate series resonance between the input node and the output node at an intermediate resonance frequency, which is between the main resonance frequency and the upper resonance frequency; and
    at least one of the two shunt equivalent impedances has a shunt resonance frequency within two percent (2%) of the intermediate resonance frequency.

16. The filter circuitry of claim 15 wherein the first shunt acoustic resonator has a first series resonance at a first resonance frequency, the second shunt acoustic resonator has a second series resonance at a second resonance frequency, and the main resonance frequency is between the first resonance frequency and the second resonance frequency.

17. The filter circuitry of claim 15 wherein the shunt resonance frequency is within one percent (1%) of the intermediate resonance frequency.

18. The filter circuitry of claim 10 wherein:
    the compensation circuit provides an upper series resonance between the input node and the output node at an upper resonance frequency, such that the main resonance frequency is below the stopband and the upper resonance frequency is above the stopband;

the compensation circuit further provides an intermediate series resonance between the input node and the output node at an intermediate resonance frequency, which is between the main resonance frequency and the upper resonance frequency;

at least one of the two shunt equivalent impedances has a shunt resonance frequency;

the at least one series acoustic resonator has a parallel resonance frequency;

both the intermediate resonance frequency and the shunt resonance frequency fall between the main resonance frequency and the parallel resonance frequency.

19. The filter circuitry of claim 18 wherein the shunt resonance frequency defines a lower edge of the stopband.

20. The filter circuitry of claim 1 wherein the first inductor and the second inductor have different inductances.

21. The filter circuitry of claim 1 wherein the at least one series acoustic resonator, the first shunt acoustic resonator, and the second shunt acoustic resonator are at least one of a bulk acoustic wave (BAW) resonator and a surface acoustic wave (SAW) resonator.

22. The filter circuitry of claim 1 wherein a fc/BW*100 is between 3.5% and 12%, wherein fc is a center frequency of the stopband of the filter circuitry, and BW is a bandwidth of the stopband.

23. The filter circuitry of claim 1 further comprising a first capacitor between the common node and the fixed voltage node.

24. The filter circuitry of claim 23 further comprising a second capacitor coupled between an intermediate node and the fixed voltage node, wherein the intermediate node resides between the shunt inductor and the first and second shunt acoustic resonators.

* * * * *